US009999150B2

(12) United States Patent
Maeda et al.

(10) Patent No.: US 9,999,150 B2
(45) Date of Patent: Jun. 12, 2018

(54) ELECTRIC POWER CONVERTER

(71) Applicant: Hitachi Automotive Systems, Ltd., Hitachinaka-shi, Ibaraki (JP)

(72) Inventors: Ken Maeda, Hitachinaka (JP); Toshiya Satoh, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 124 days.

(21) Appl. No.: 14/646,935

(22) PCT Filed: Nov. 6, 2013

(86) PCT No.: PCT/JP2013/079949
§ 371 (c)(1),
(2) Date: May 22, 2015

(87) PCT Pub. No.: WO2014/103517
PCT Pub. Date: Jul. 3, 2014

(65) Prior Publication Data
US 2015/0305188 A1    Oct. 22, 2015

(30) Foreign Application Priority Data

Dec. 26, 2012  (JP) ................. 2012-281937

(51) Int. Cl.
*H02M 7/00* (2006.01)
*H05K 7/02* (2006.01)
*H05K 7/14* (2006.01)

(52) U.S. Cl.
CPC .............. *H05K 7/02* (2013.01); *H02M 7/003* (2013.01); *H05K 7/1432* (2013.01)

(58) Field of Classification Search
CPC ........ H05K 7/02; H05K 7/1432; H05K 7/023; H05K 7/026; H05K 7/04; H05K 7/1427;
(Continued)

(56) References Cited

U.S. PATENT DOCUMENTS

2008/0049476 A1  2/2008  Azuma et al.
2008/0130223 A1* 6/2008  Nakamura ............ H02M 7/003
                                                        361/689
(Continued)

FOREIGN PATENT DOCUMENTS

JP    2002-16202 A    1/2002
JP    2008-29117 A    2/2008
(Continued)

OTHER PUBLICATIONS

International Search Report (PCT/ISA/210) dated Feb. 10, 2014, with English translation (three (3) pages).
(Continued)

*Primary Examiner* — Timothy J Dole
*Assistant Examiner* — Carlos Rivera-Perez
(74) *Attorney, Agent, or Firm* — Crowell & Moring LLP

(57) ABSTRACT

An object of the invention is to improve the cooling performance for a bus bar and a smoothing capacitor in an electric power converter. The electric power converter of the present invention includes a power semiconductor module including a power semiconductor element that converts a DC current to an AC current, a capacitor cell that smooths a DC voltage, a bus bar that electrically connects the power semiconductor module and the capacitor cell, a base plate that is disposed between the bus bar and the capacitor cell, and a sealing material that seals the capacitor cell, the bus bar, and the base plate. The base plate forms an opening through which a capacitor terminal extending from the capacitor cell passes.

6 Claims, 22 Drawing Sheets

(58) Field of Classification Search
CPC .. H05K 7/2089; H05K 7/209; H05K 7/20927;
H05K 7/20945; H05K 7/06; H05K 7/08;
H05K 7/12; H05K 1/0215; H02M 7/003;
H02M 7/537; H02M 7/5387
USPC ......... 363/15–17, 35, 37, 40–47, 50, 55–58,
363/95–99, 123, 131–134, 141, 142, 144,
363/146, 147; 361/142, 271,
361/274.1–274.3, 299.1–299.5, 298.2,
361/301.1, 301.4, 328–330, 688, 689,
361/699, 704, 717–724, 728–730,
361/734–736, 760, 763; 180/65.1–65.29
See application file for complete search history.

(56) References Cited

U.S. PATENT DOCUMENTS

| 2011/0291236 | A1* | 12/2011 | Hayashi ............ H01L 23/49537 |
| | | | 257/532 |
| 2012/0170217 | A1 | 7/2012 | Nishikimi et al. |
| 2013/0094269 | A1 | 4/2013 | Maeda et al. |
| 2014/0085955 | A1* | 3/2014 | Maeda .................. H02M 7/003 |
| | | | 363/132 |

FOREIGN PATENT DOCUMENTS

| JP | 2011-217550 A | 10/2011 | |
| JP | 2012-100532 A | 5/2012 | |
| JP | 2012-249480 A | 12/2012 | |
| WO | WO 2012165226 A1 * | 12/2012 | ............ H02M 7/003 |

OTHER PUBLICATIONS

Japanese Office Action issued in counterpart Japanese Application No. 2012-281937 dated Sep. 21, 2016 with English-language translation (six (6) pages).

Chinese-language Office Action issued in counterpart Chinese Application No. 201380061568.8 dated Jul. 11, 2017 with English translation (12 pages).

* cited by examiner

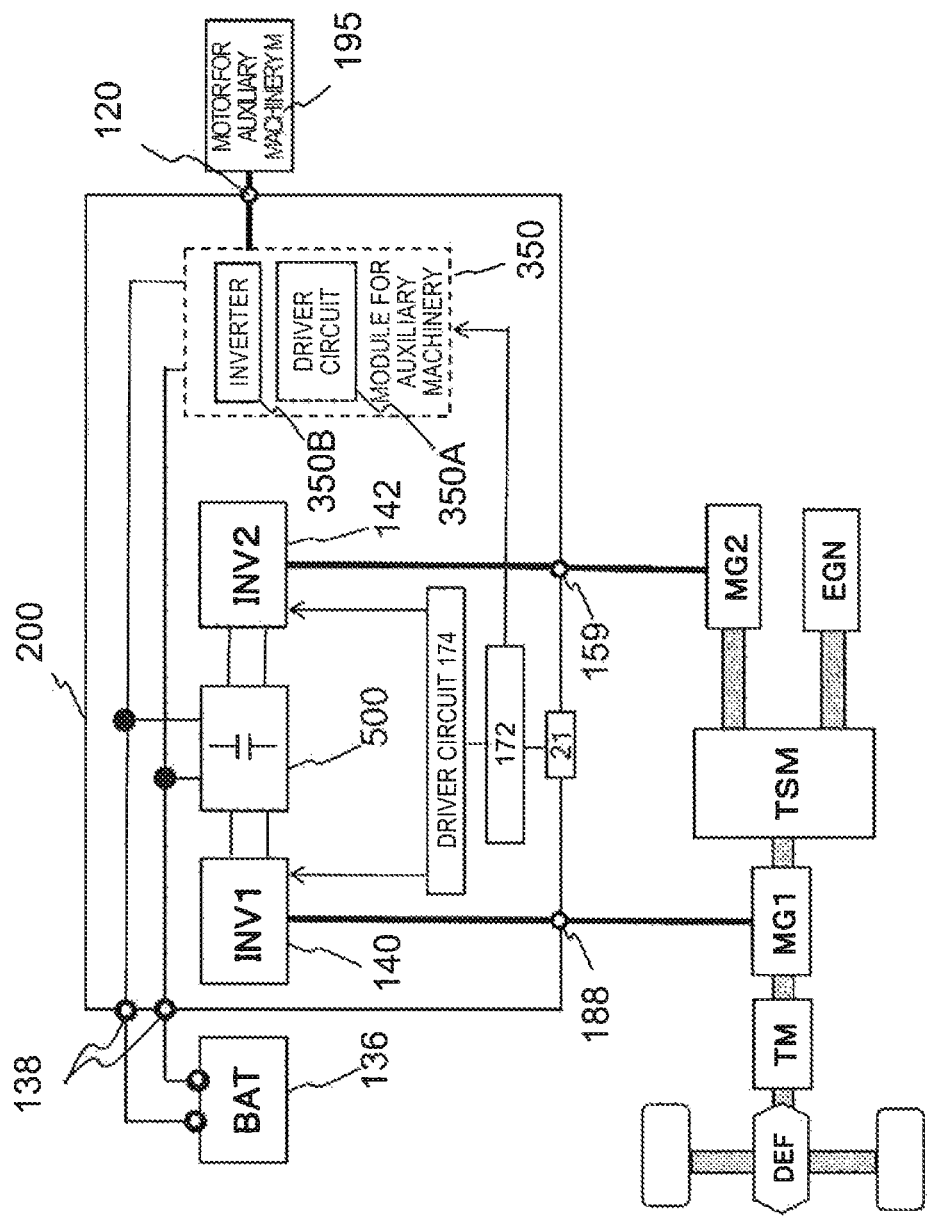
[Fig. 1]

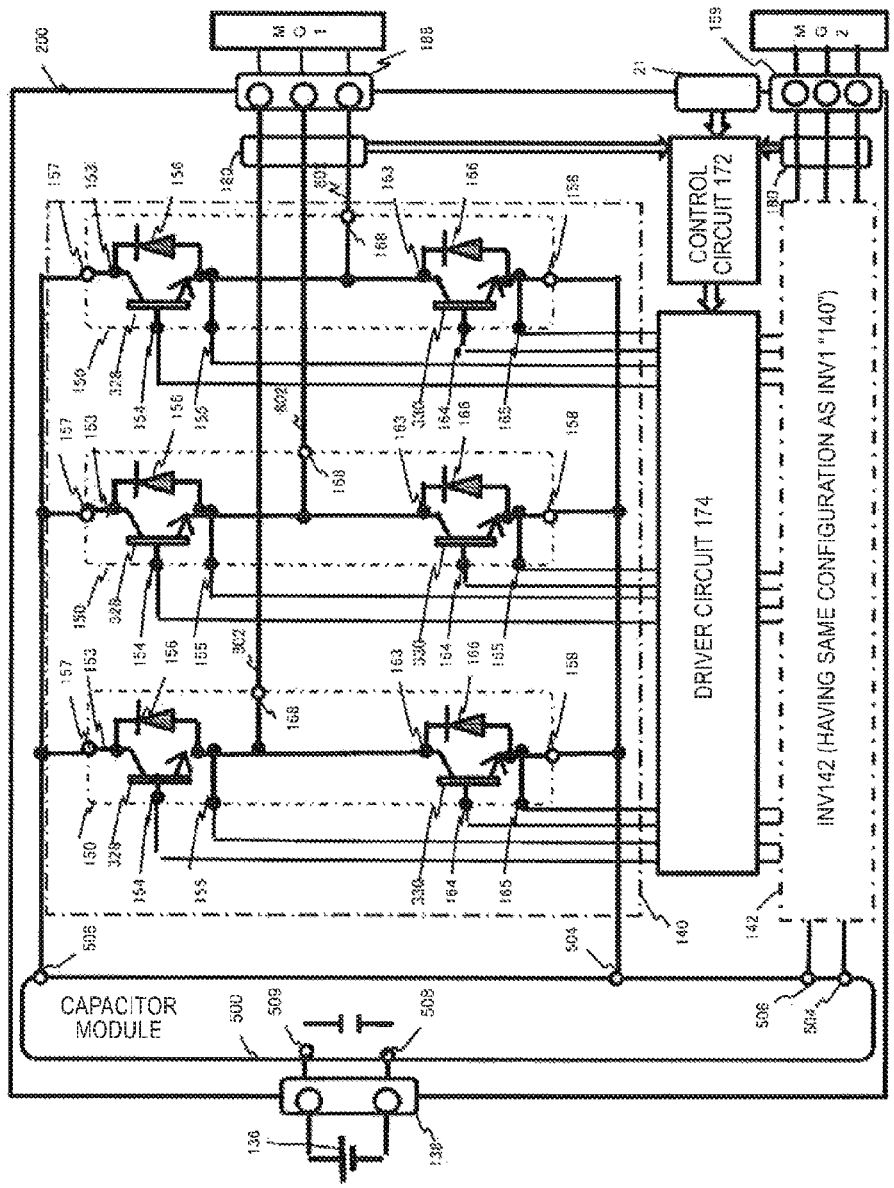

[Fig. 3]
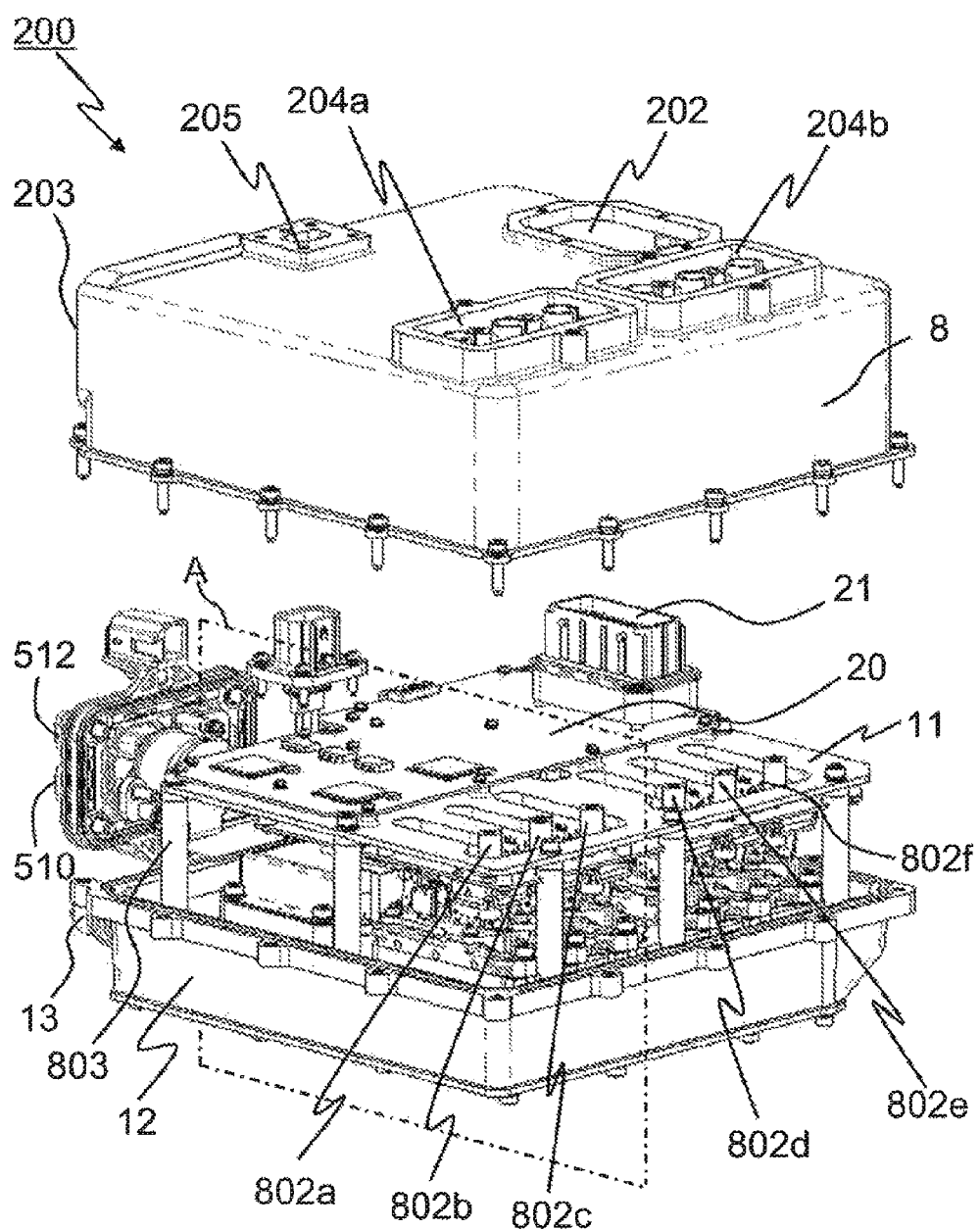

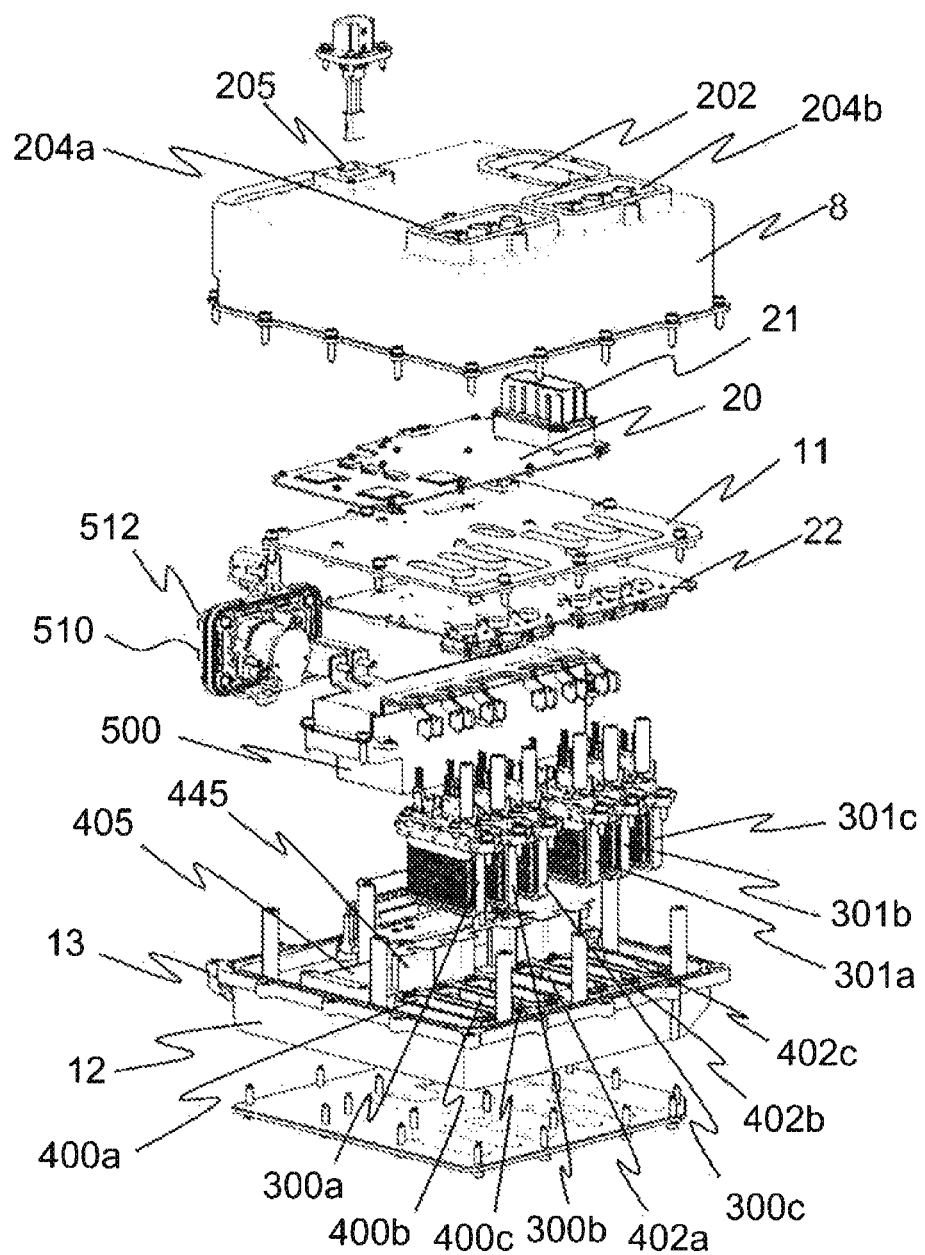
[Fig. 4]

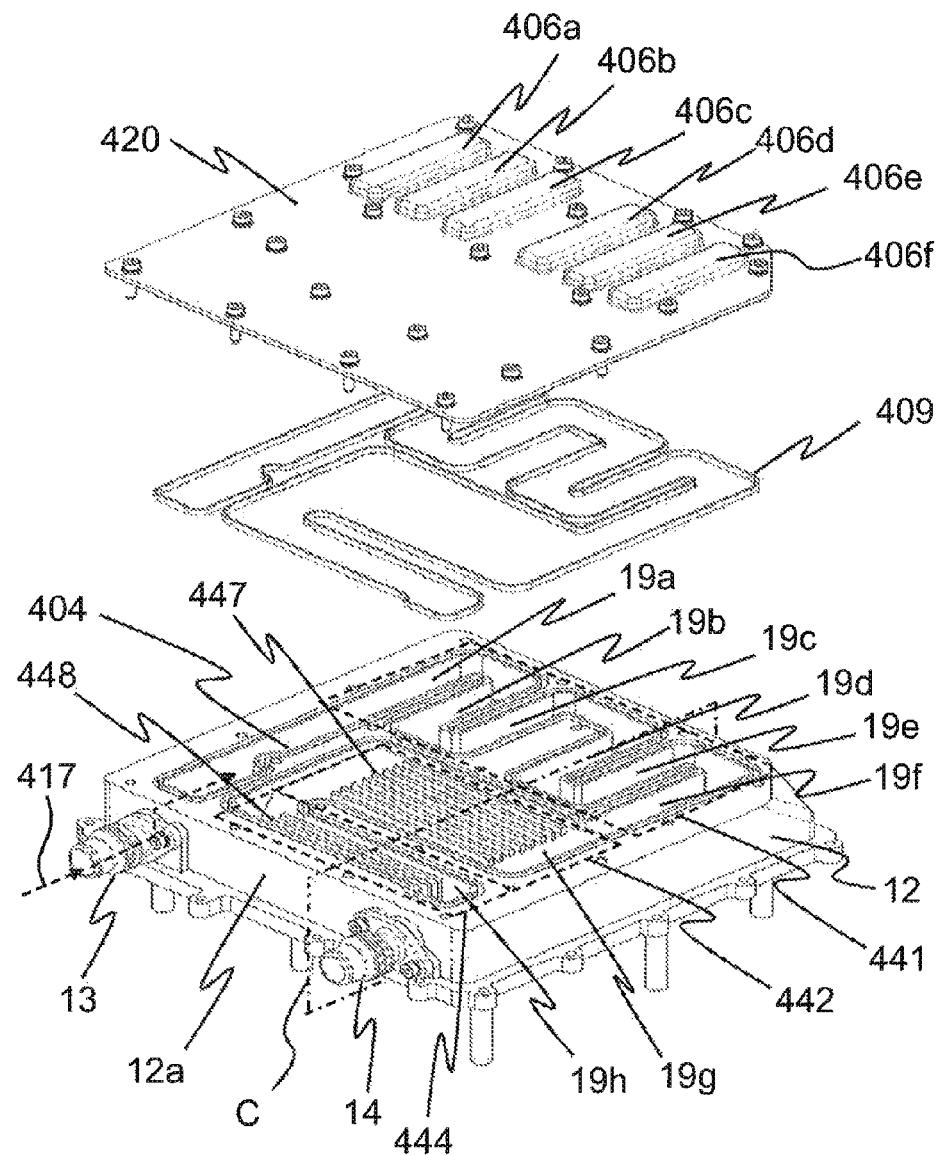
[Fig. 5]

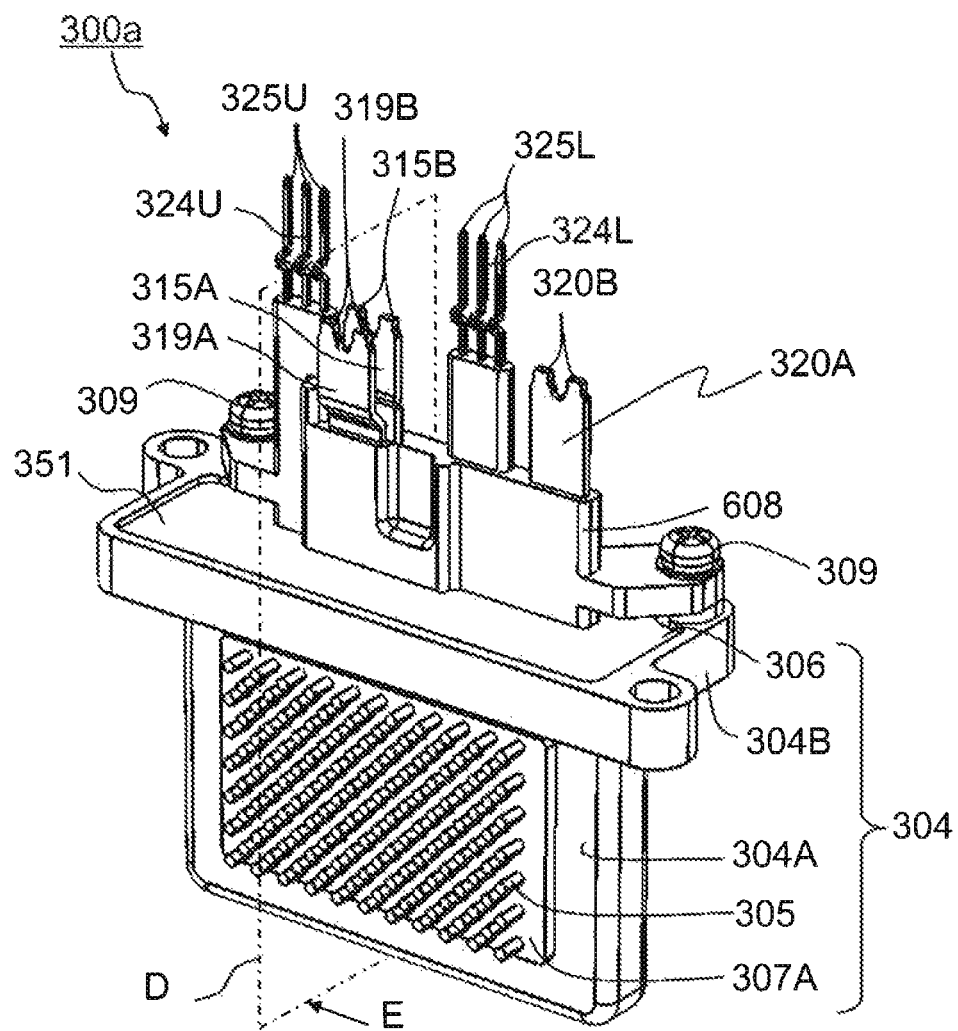
[Fig. 6(a)]

[Fig. 6(b)]
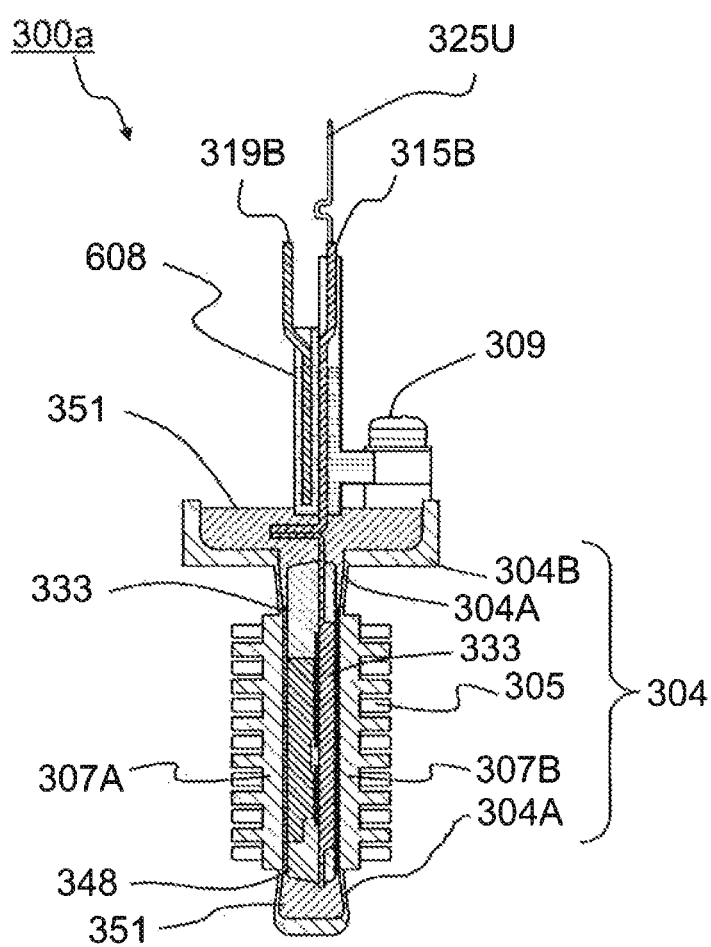

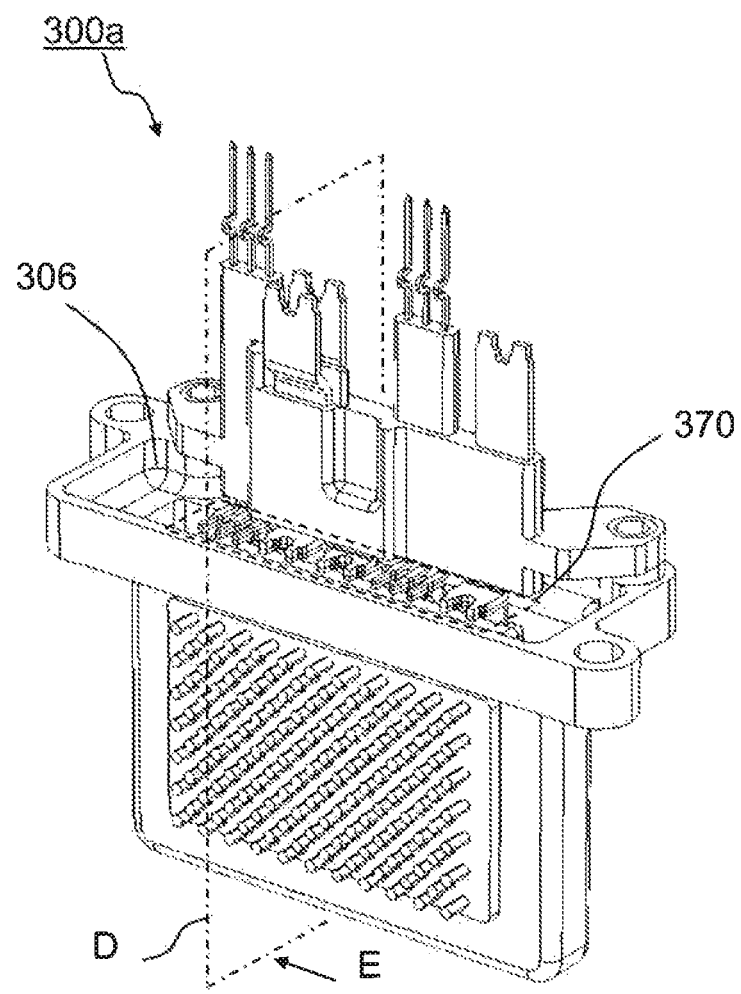
[Fig. 7(a)]

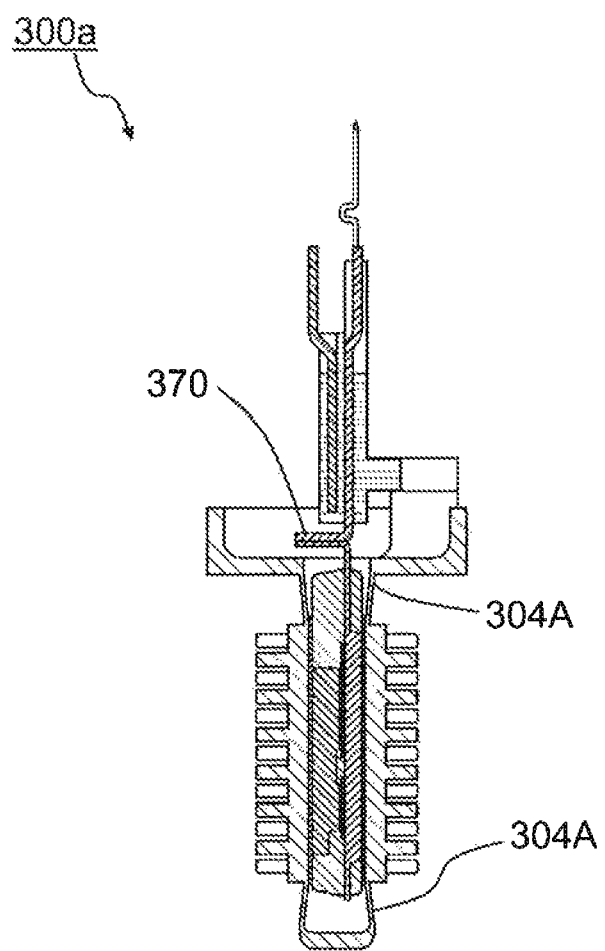

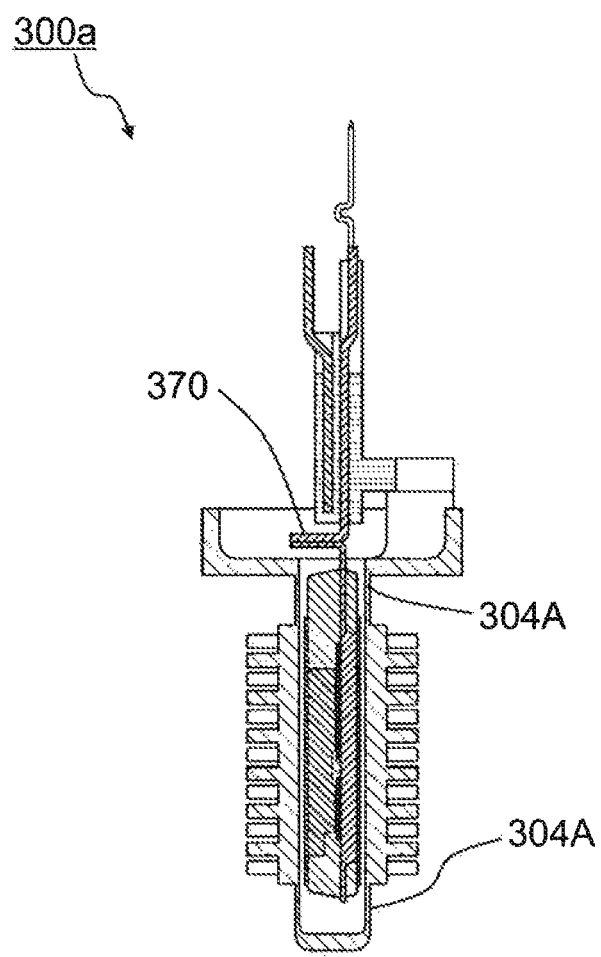
[Fig. 7(c)]

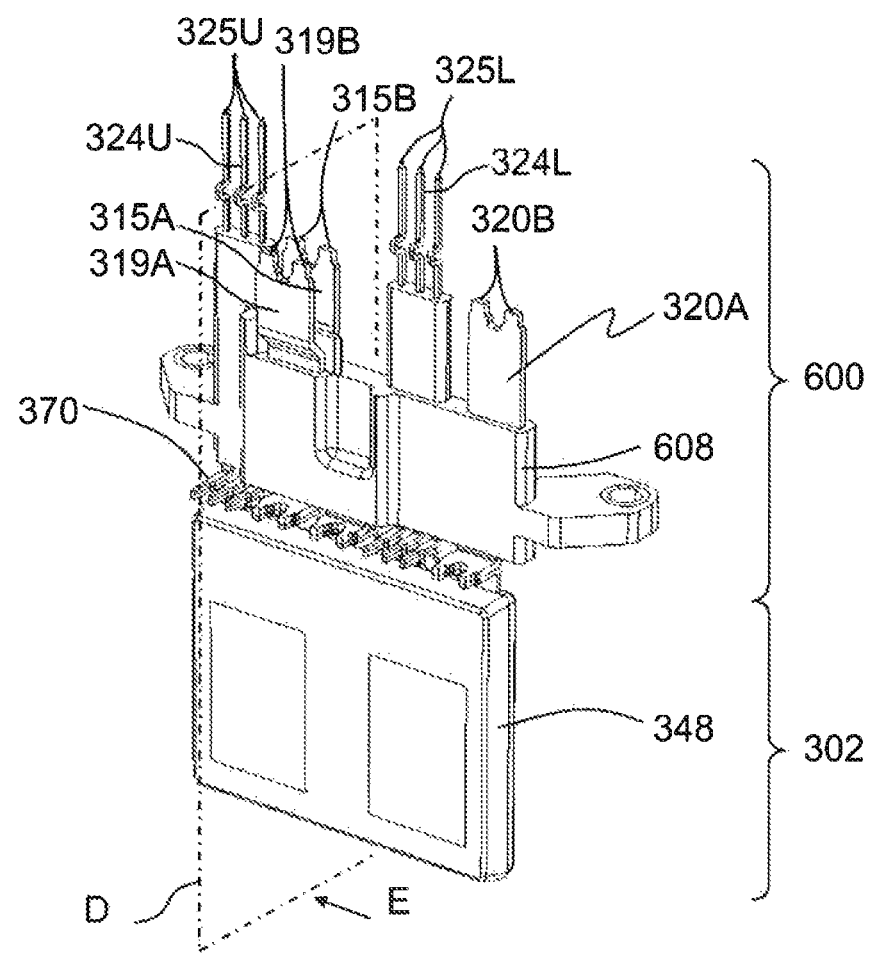
[Fig. 8(a)]

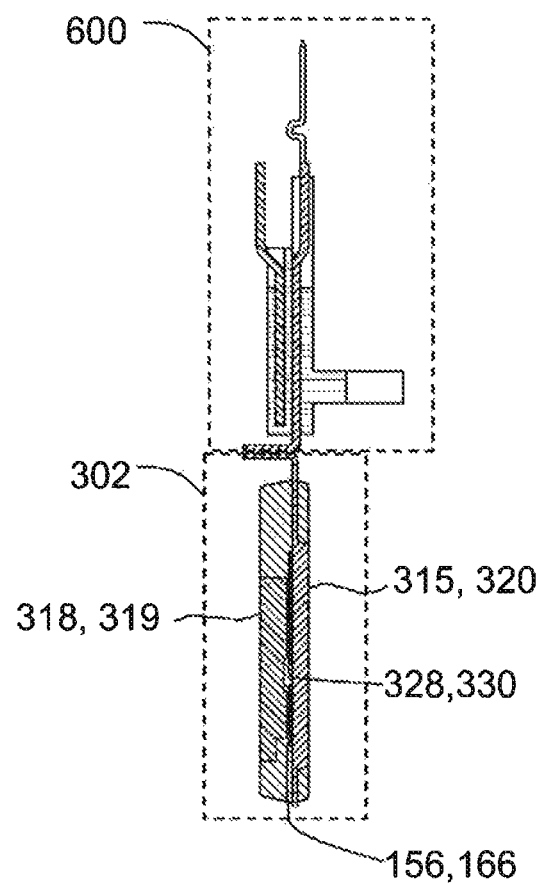

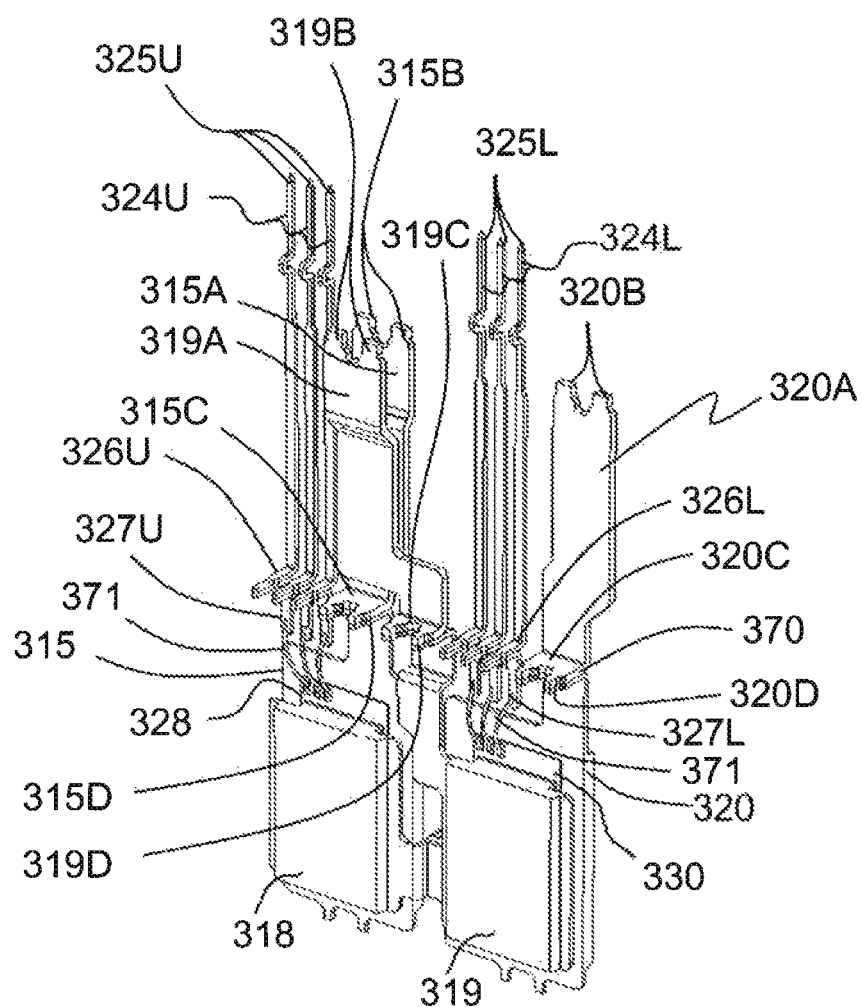
[Fig. 9]

[Fig. 10]
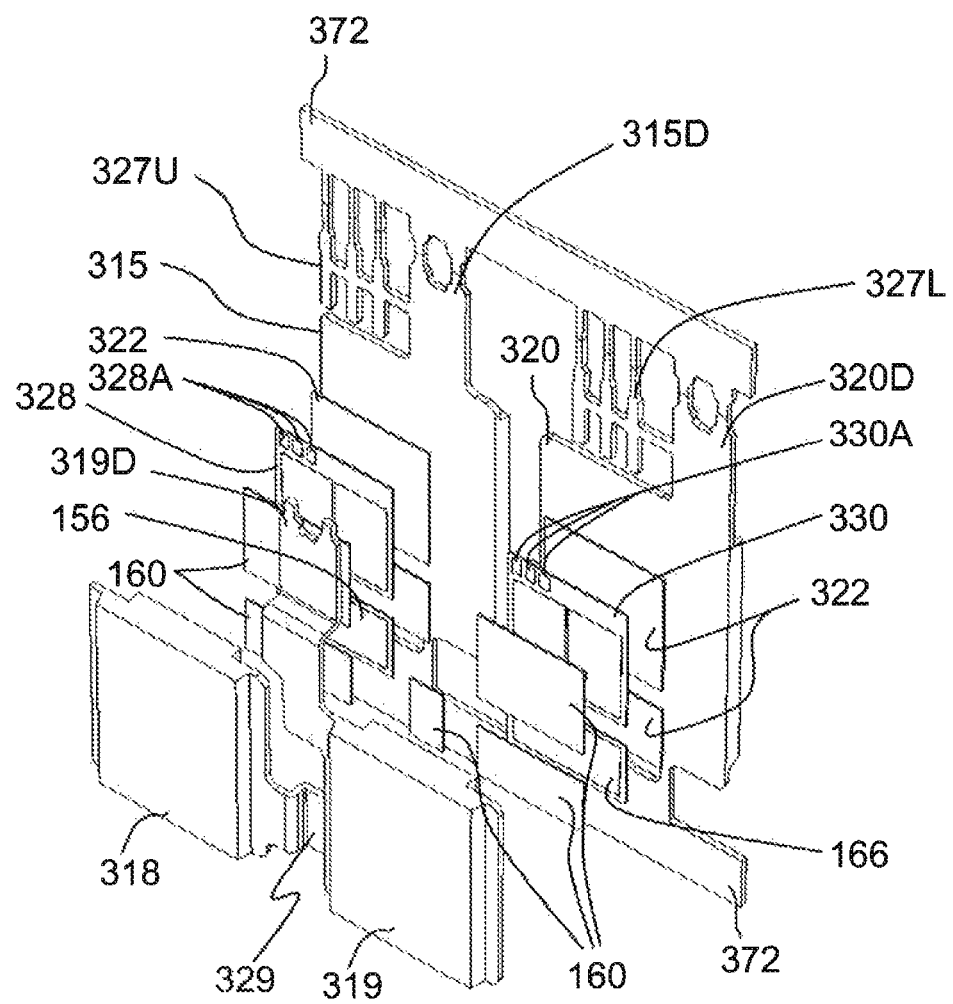

[Fig. 11(a)]
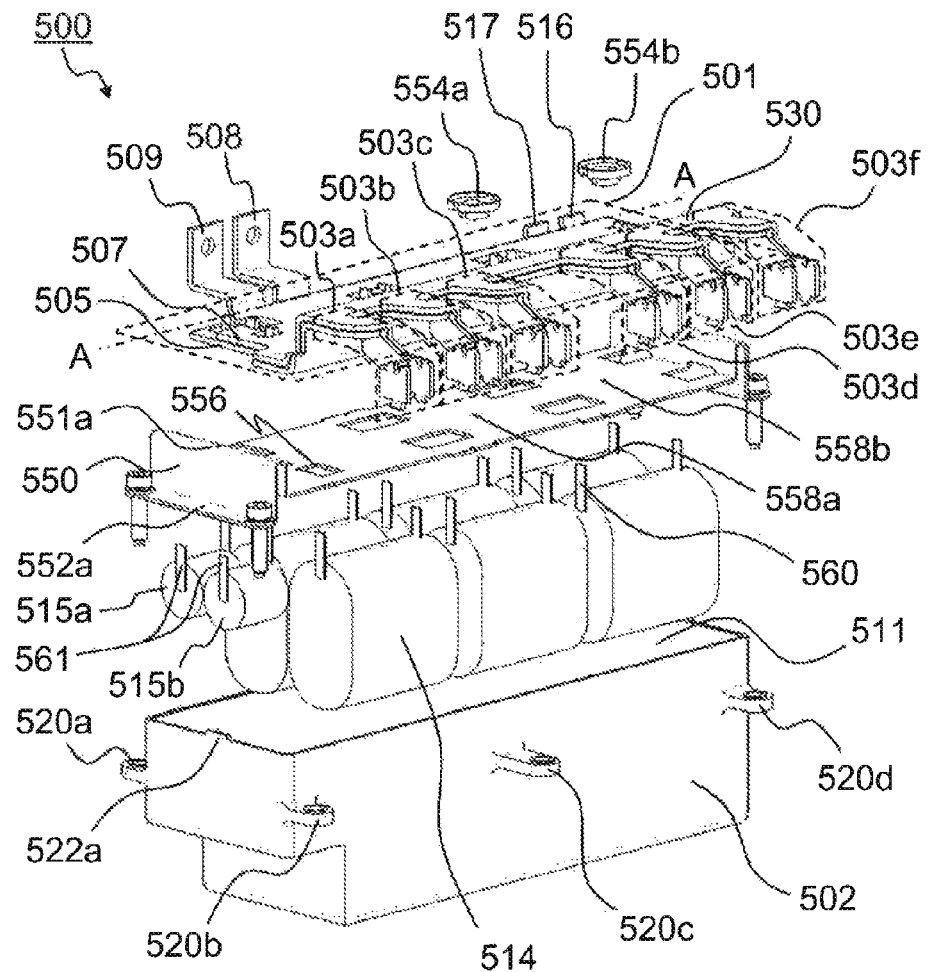
[Fig. 11(b)]
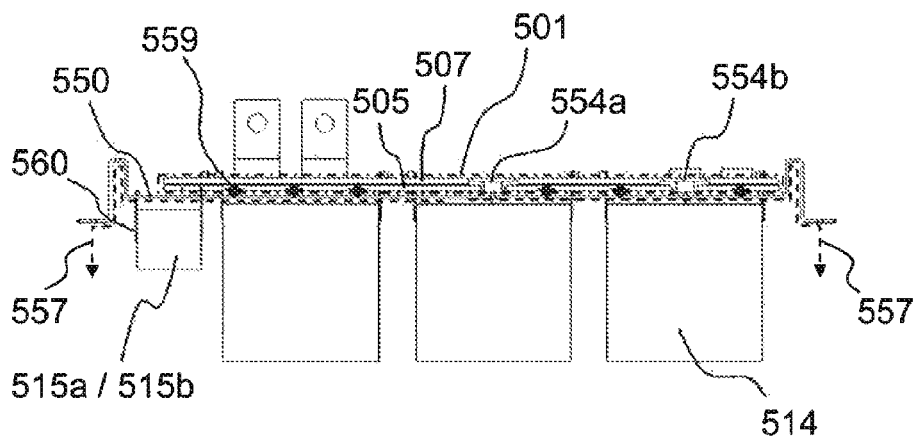

[Fig. 11(c)]
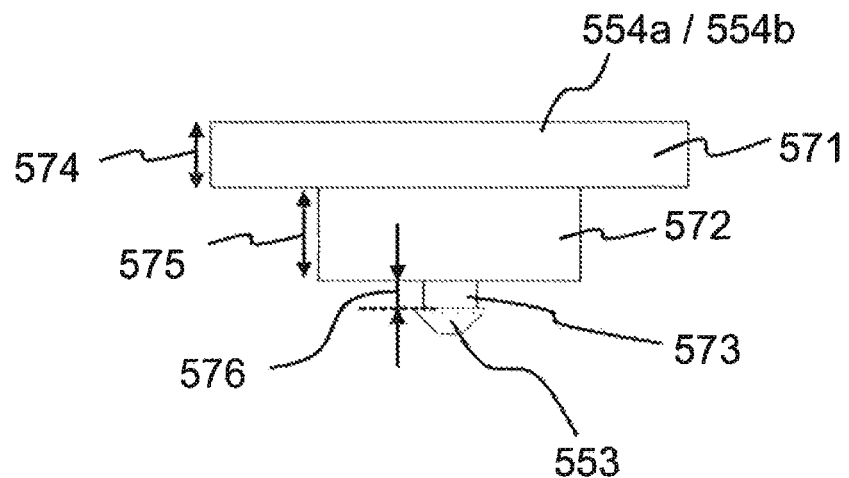
[Fig. 11(d)]
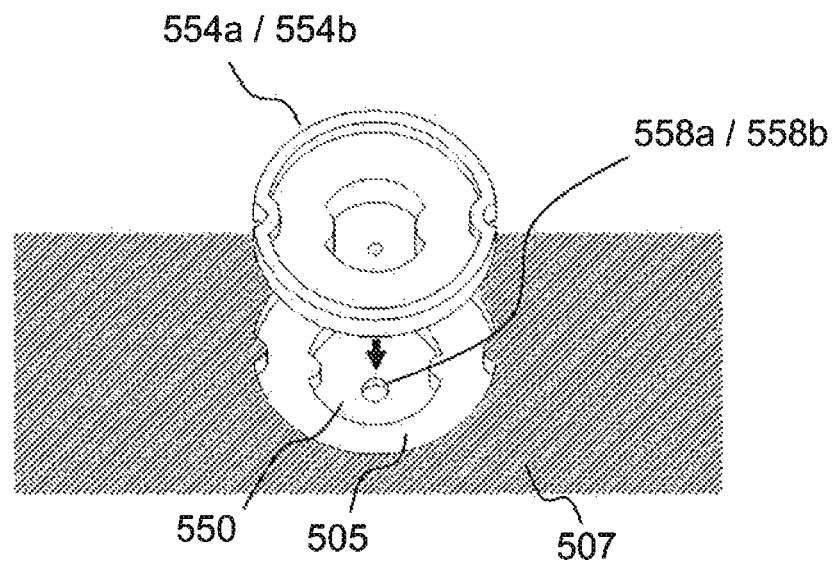

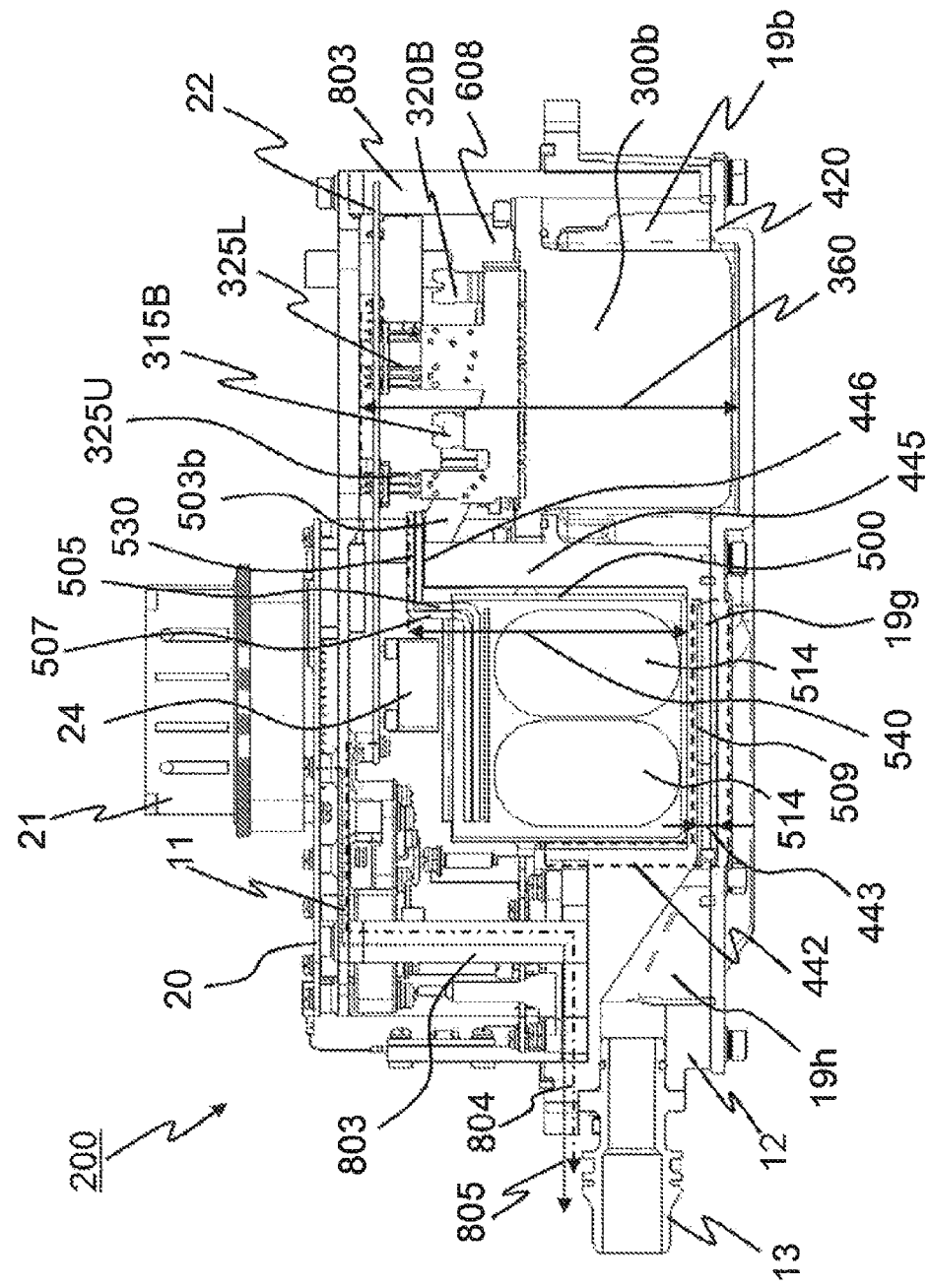
[Fig. 12]

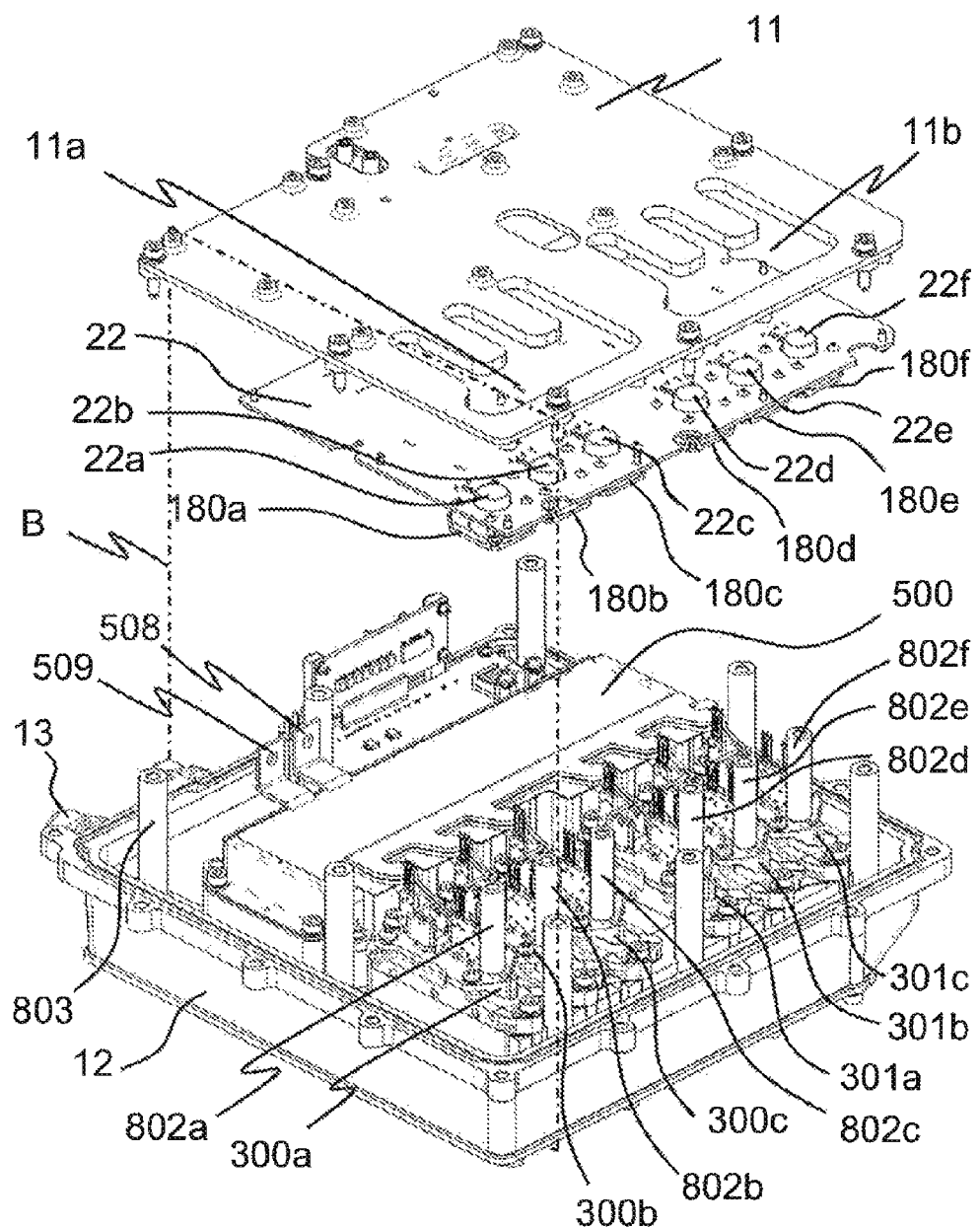
[Fig. 13]

[Fig. 14]
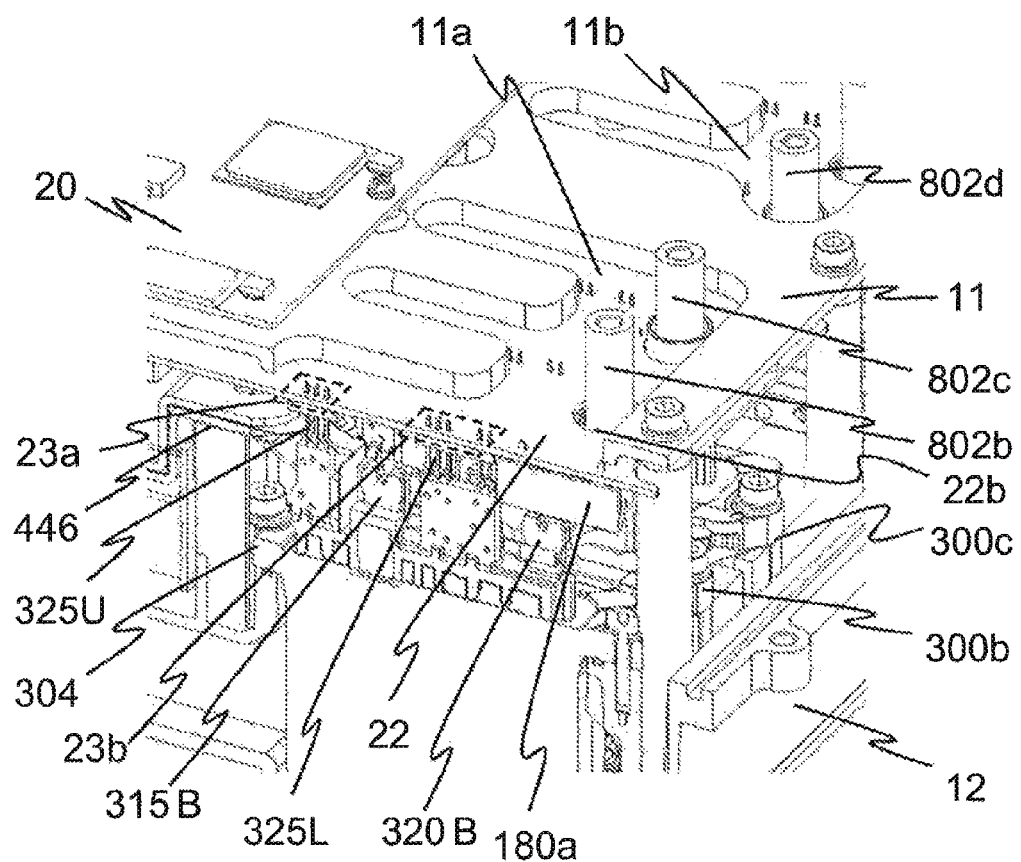

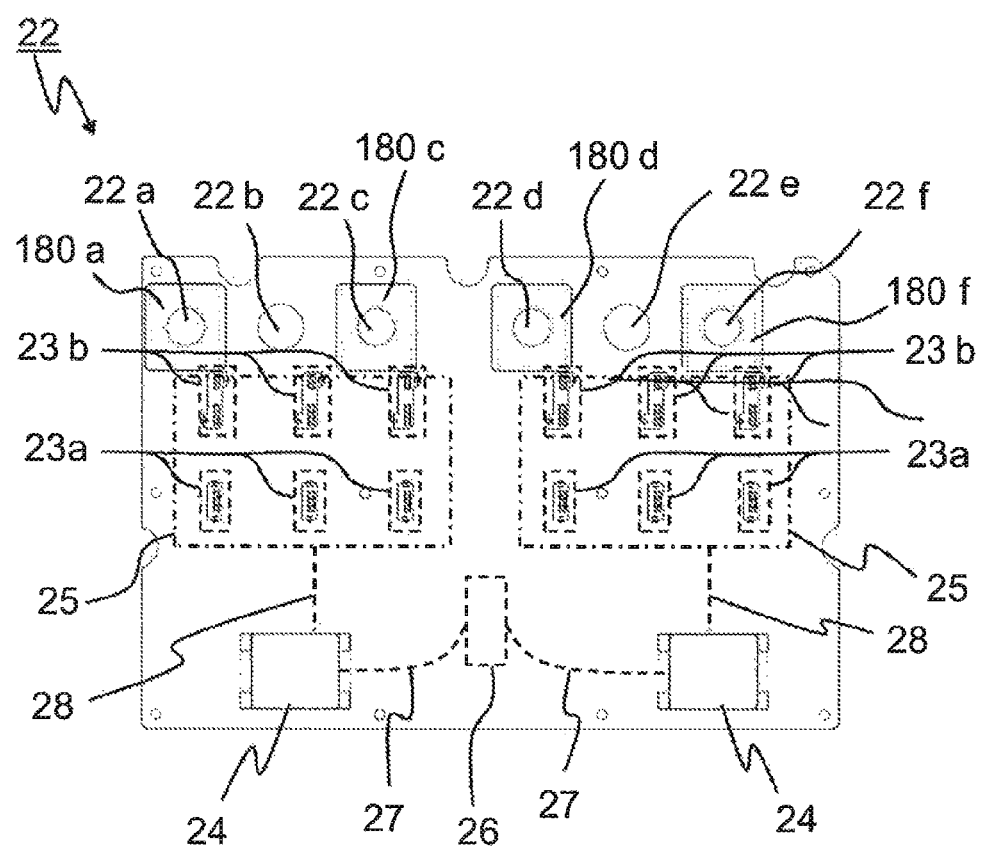
[Fig. 15]

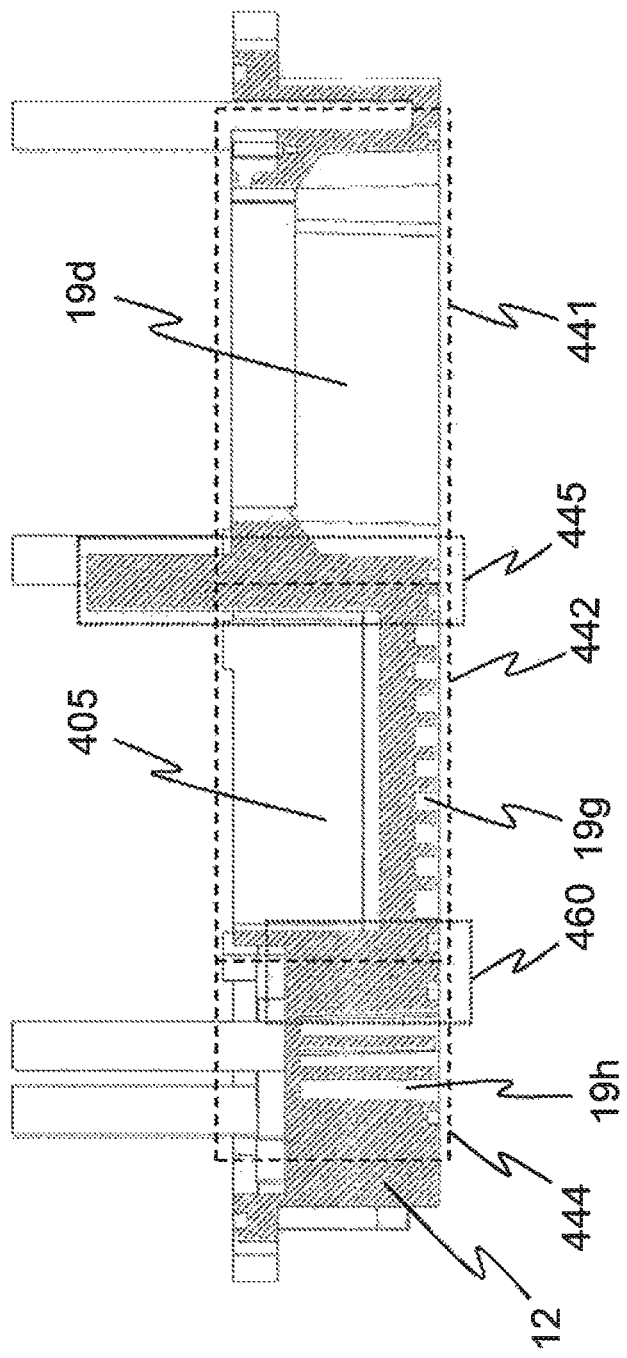
[Fig. 16]

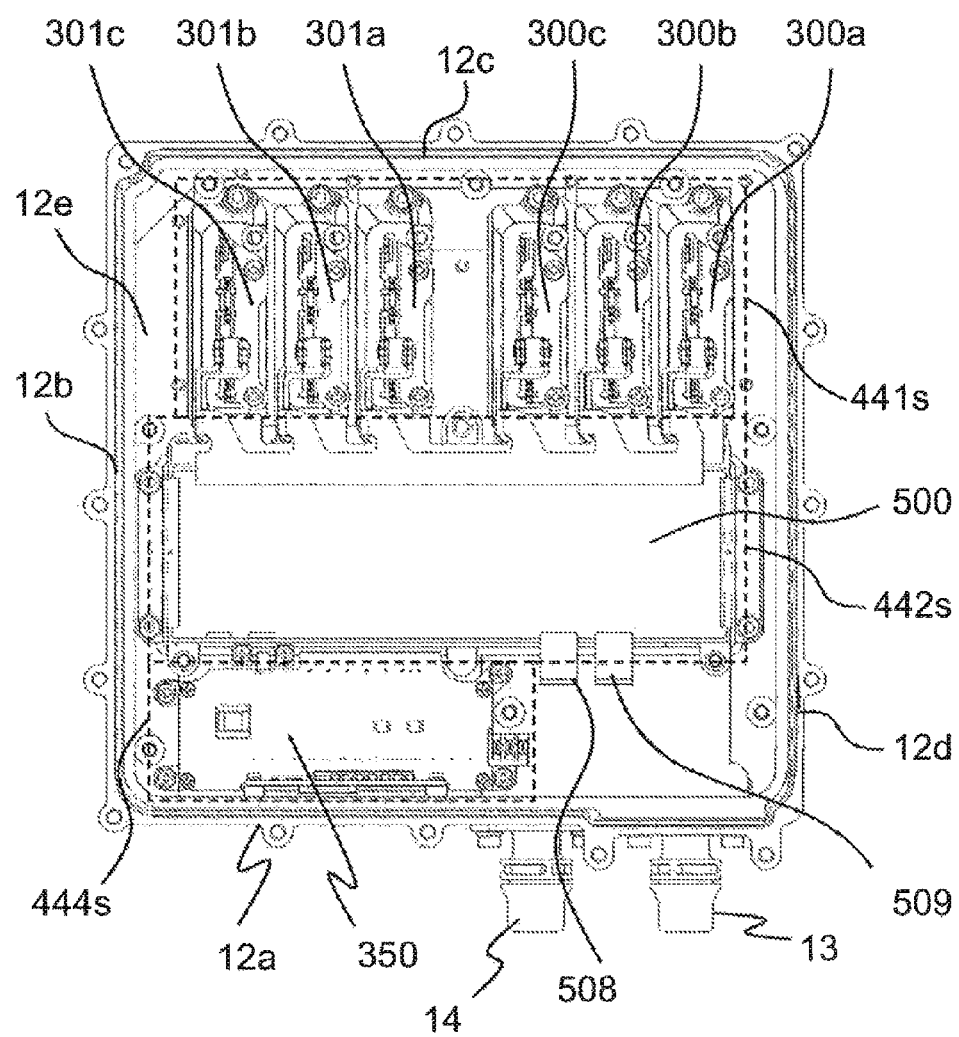
[Fig. 17]

ELECTRIC POWER CONVERTER

TECHNICAL FIELD

The present invention relates to an electric power converter that is used to convert DC power to AC power, or to convert AC power to DC power, and more particularly, to an electric power converter that is used in a hybrid car or an electric vehicle.

BACKGROUND ART

In general, the electric power converter includes an inverter circuit that receives DC power and generates AC power, and a control circuit that controls the inverter circuit. Recently, miniaturization of the electric power converter has been demanded. Particularly, in fields of the hybrid car or the electric vehicle, it is desirable for the electric power converter to be mounted in a space as small as possible on the outside of a vehicle room, particularly, in an engine room, and additional miniaturization is demanded to improve mountability on the vehicle.

In addition, an operating hour or operating conditions (high output torque conditions) of a motor that is used as a driving source tend to increase. Therefore, in a bus bar that electrically connects a smoothing capacitor and a power module, there is a problem of reduction of heat generation which is caused by an increase in a current density due to miniaturization, and an increase in loss due to large current.

An effect of reducing a thermal effect of a bus bar on a smoothing capacitor in which a maximum using temperature is limited is described in PTL 1. However, an additional cooling countermeasure is necessary due to acceleration of an increase in a current density and a large current.

CITATION LIST

Patent Literature

PTL 1: JP-A-2012-100532

SUMMARY OF INVENTION

Technical Problem

An object of the invention is to improve cooling performance of a bus bar and a smoothing capacitor of an electric power converter.

Solution to Problem

To solve the above-described problem, according to an aspect of the invention, there is provided an electric power converter including: a power semiconductor module including a power semiconductor element that converts a DC current to an AC current, a capacitor cell that smooths a DC voltage, a bus bar that electrically connects the power semiconductor module and the capacitor cell, a base plate that is disposed between the bus bar and the capacitor cell, and a sealing material that seals the capacitor cell, the bus bar, and the base plate. The base plate forms an opening through which a capacitor terminal extending from the capacitor cell passes.

According to this, a heat path, on which heat generated in a bus bar is radiated toward a flow channel forming body through a base plate, is formed, and thus it is possible to improve a heat-reception influence from the bus bar of a smoothing capacitor.

Advantageous Effects of Invention

According to the invention, heat-reception in a cell of the smoothing capacitor which is caused by heat generation in the bus bar is reduced, and thus it is possible to use the smoothing capacitor in a limitation of maximum using temperature. The base plate is an additional component, but serves as a positioning jig between a case and a bus bar, thereby contributing to a cost reduction in the process of manufacturing the smoothing capacitor. In addition, the base plate has a function of grounding a capacitor for a noise filter, and thus a grounding distance becomes short. Accordingly, an improvement in electromagnetic compatibility (EMC) due to a reduction in impedance is attained in comparison to a structure in the related art.

BRIEF DESCRIPTION OF DRAWINGS

FIG. 1 is a system diagram illustrating a system of a hybrid car.

FIG. 2 is a circuit diagram illustrating a configuration of an electric circuit illustrated in FIG. 1.

FIG. 3 is an exploded perspective view illustrating a configuration of an electric power converter.

FIG. 4 is a perspective view illustrating the entire configuration of the electric power converter by exploding constituent elements.

FIG. 5 is a view illustrating a flow channel forming body 12 when viewing the flow channel forming body 12 illustrated in FIG. 4 from a bottom side.

FIG. 6(a) is a perspective view illustrating external appearance of a power semiconductor module 300a.

FIG. 6(b) is a cross-sectional view of the power semiconductor module 300a.

FIG. 7(a) is a perspective view illustrating the power semiconductor module 300a from which a screw 309 and a second sealing resin 351 are removed.

FIG. 7(b) is a cross-sectional view which is taken along a cross-section D and is viewed from a direction E similar to FIG. 6(b).

FIG. 7(c) is a cross-sectional view before a fin 305 is pressed and a thin portion 304A is deformed.

FIG. 8(a) is a perspective view illustrating the power semiconductor module 300a from which a module case 304 is further removed from a state illustrated in FIG. 7.

FIG. 8(b) is a cross-sectional view which is taken along the cross-section D and is viewed from the direction E similar to FIG. 6(b) and FIG. 7(b).

FIG. 9 is a perspective view of the power semiconductor module 300a from which a first sealing resin 348 and an interconnection insulating portion 608 are further removed from a state illustrated in FIG. 8.

FIG. 10 is a view illustrating a process of assembling a primary module sealing body 302.

FIG. 11(a) is an exploded perspective view illustrating an internal structure of a capacitor module 500.

FIG. 11(b) is a lateral cross-sectional view illustrating the internal structure of the capacitor module 500.

FIG. 11(c) is a side view of a positioning clip 554a that is mounted to the capacitor module 500.

FIG. 11(d) is a perspective view of the positioning clip 554a that is mounted to the capacitor module 500.

FIG. 12 is a cross-sectional view of the electric power converter 200 which is taken along a plane A in FIG. 3.

FIG. 13 is a perspective view in which a cover 8 and a control circuit substrate 20 are removed, and a driver circuit substrate 22 and a metal base plate 11 are exploded.

FIG. 14 is a cross-sectional perspective view taken along a plane B in FIG. 13.

FIG. 15 is a bottom view of the driver circuit substrate 22.

FIG. 16 is a cross-sectional view taken along a plane C of the flow channel forming body 12 illustrated in FIG. 5.

FIG. 17 is a top view of the electric power converter 200 from which the cover 8, the control circuit substrate 20, the metal base plate 11, and the driver circuit substrate 22 are removed.

DESCRIPTION OF EMBODIMENTS

Next, an embodiment of the invention will be described with reference to the accompanying drawings. FIG. 1 is a system diagram when an electric power converter according to the invention is applied to a so-called hybrid car that travels by using both an engine and a motor. The electric power converter according to the invention is applicable to not only a hybrid car but also a so-called electric vehicle that travels by using a motor alone. In addition, the electric power converter can be used as an electric power converter that drives a motor that is used in typical industrial equipment. However, as described above or like the following description, when the electric power converter according to the invention is applied, particularly, to the hybrid car or the electric vehicle, excellent effects are obtained from the viewpoint of miniaturization, the viewpoint of reliability, and various other viewpoints. An electric power converter that is applied to the hybrid car has approximately the same configuration as an electric power converter that is applied to the electric vehicle, and the electric power converter that is applied to the hybrid car will be described as a representative example.

FIG. 1 is a view illustrating a control block of a hybrid car (hereinafter, referred to as an "HEV"). An engine EGN, a motor generator MG1, and a motor generator MG2 generate torque for vehicle traveling. In addition, the motor generator MG1 and the motor generator MG2 generate rotation torque, and have a function of converting mechanical energy, which is applied to the motor generator MG1 or the motor generator MG2 from the outside, to electric power. For example, the motor generator MG1 or MG2 is a synchronous machine or an induction machine, and functions either as a motor or as a generator in accordance with an operating method as described above.

An output of the engine EGN and output torque of the motor generator MG2 are transmitted to the motor generator MG1 through a power distribution mechanism TSM, and rotation torque from the power distribution mechanism TSM or rotation torque generated by the motor generator MG1 is transmitted to wheels through a transmission TM and a differential gear DEF. On the other hand, during regenerative braking operation, rotation torque is transmitted from the wheels to the motor generator MG1, and AC power is generated on the basis of the rotation torque that is supplied. The AC power that is generated is converted into DC power by an electric power converter 200 as will be described later, and charges a high-voltage battery 136, and the electric power that is charged is used again as traveling energy. In addition, when the electric power that is stored in the high-voltage battery 136 is small, rotation energy that is generated by the engine EGN is converted into AC power by the motor generator MG2, and the AC power is converted into DC power by the electric power converter 200 to charge the battery 136. Transmission of mechanical energy from the engine EGN to the motor generator MG2 is performed by the power distribution mechanism TSM.

Next, the electric power converter 200 will be described. An inverter circuit 140 and an inverter circuit 142 are electrically connected to the battery 136 through a DC connector 138. Transmission and reception of electric power are performed between the battery 136 and the inverter circuit 140 or 142. In a case of operating the motor generator MG1 as a motor, the inverter circuit 140 generates AC power on the basis of DC power supplied from the battery 136 through the DC connector 138, and supplies the AC power that is generated to the motor generator MG1 through an AC connector 188. The configuration including the motor generator MG1 and the inverter circuit 140 operates as a first electromotive power generation unit. Similarly, in a case of operating the motor generator MG2 as a motor, the inverter circuit 142 generates AC power on the basis of DC power that is supplied from the battery 136 through the DC connector 138, and supplies the AC power that is generated to the motor generator MG2 through an AC terminal 159. The configuration including the motor generator MG2 and the inverter circuit 142 operates as a second electromotive power generation unit. The first electromotive power generation unit and the second electromotive power generation unit may be allowed to operate as a motor or an electric power generator in accordance with an operation state, or may be allowed to operate for a different purpose. In addition, a single side may be stopped without operation.

In addition, in this embodiment, a vehicle can be driven in accordance with the power of the motor generator MG1 alone by allowing the first electromotive power generation unit to operate as an electromotive unit by using electric power of the battery 136. In addition, in this embodiment, the battery 136 can be charged by setting the first electromotive power generation unit or the second electromotive power generation unit as a power generation unit to operate by using power transmitted from the engine EGN or power transmitted from wheels and to generate electric power.

The battery 136 is used as a power source for operation of a motor for auxiliary machinery 195. Examples of the motor for auxiliary machinery include a motor that drives a compressor of an air-conditioner, and a motor that drives a hydraulic pump for cooling. When a DC current transmitted from the battery 136 is supplied to a power module for auxiliary machinery 350, an AC power is generated in the power module for auxiliary machinery 350, and the AC power is supplied to the motor for auxiliary machinery 195 through an AC terminal 120. Basically, the power module for auxiliary machinery 350 has the same circuit configuration and function as those of the inverter circuit 140 or 142, and controls a phase, a frequency, and electric power of an alternating current that is supplied to the motor for auxiliary machinery 195. A capacity of the motor for auxiliary machinery 195 is smaller than a capacity of the motor generator MG1 or MG2, and thus the maximum electric power that is converted in the power module for auxiliary machinery 350 is smaller than that in the inverter circuit 140 or 142. However, as described above, the basic configuration or the basic operation of the power module for auxiliary machinery 350 are approximately the same as in the inverter circuit 140 or 142. In addition, the electric power converter 200 includes a capacitor module 500 configured to smooth DC power that is supplied to the inverter circuit 140, the inverter circuit 142, or an inverter circuit 350B.

The electric power converter 200 includes a communication connector 21 for reception of a command from an upper-layer control device or for transmission of data, which indicates a state, to the upper-layer control device. On the basis of the command from the connector 21, a control circuit 172 performs arithmetic processing to obtain an amount of control of the motor generator MG1, the motor generator MG2, or the motor for auxiliary machinery 195. In addition, the control circuit 172 determines operation as a motor or operation as a power generator, and generates a control pulse on the basis of the arithmetic processing. The control pulse is supplied to a driver circuit 174 or a driver circuit 350A of the power module for auxiliary machinery 350. The power module for auxiliary machinery 350 may include a dedicated control circuit. In this case, the dedicated control circuit generates a control pulse on the basis of a command from the connector 21, and supplies the control pulse to the driver circuit 350A of the power module for auxiliary machinery 350.

The driver circuit 174 generates a drive pulse for control of the inverter circuit 140 or the inverter circuit 142 on the basis of the control pulse. In addition, the driver circuit 350A generates a control pulse for drive of the inverter circuit 350B of the power module for auxiliary machinery 350.

Next, a configuration of an electrical circuit of the inverter circuit 140 or the inverter circuit 142 will be described with reference to FIG. 2. A circuit configuration of the inverter circuit 350B of the power module for auxiliary machinery 350 which is illustrated in FIG. 1 is basically similar to a circuit configuration of the inverter circuit 140, and thus in FIG. 2, description of a specific circuit configuration of the inverter 350B will be omitted, and the inverter circuit 140 will be described as a representative example. However, in the power module for auxiliary machinery 350, output power is small, and thus a semiconductor chip that constitutes an upper arm or a lower arm of each phase, as will be described later, or a circuit for connection of the chip is disposed in the power module for auxiliary machinery 350 in an integrated manner.

In addition, the inverter circuit 140 or the inverter circuit 142 are very similar to each other in a circuit configuration or operation, and thus the inverter circuit 140 will be described as a representative example.

However, in the following description, an insulation gate type bipolar transistor is used as a semiconductor element, and will be simply referred to as an "IGBT". The inverter circuit 140 includes an upper and lower arm series circuit 150, which is constituted by an IGBT 328 and a diode 156 which operate as an upper arm, and an IGBT 330 and a diode 166 which operate as a lower arm, in correspondence with three phases including a U-phase, a V-phase, and a W-phase of AC power to be output.

In this embodiment, the three phases correspond to respective winding wires of three phases of an armature winding wire of the motor generator MG1. The upper and lower arm series circuit 150 of the three phases outputs an AC current from an intermediate electrode 168 that is a midpoint portion of the series circuit. The AC current is connected to the following AC bus bar 802 that is an AC power line to the motor generator MG1 through the AC terminal 159 or the AC connector 188.

A collector electrode 153 of the IGBT 328 in the upper arm is electrically connected to a positive-electrode-side capacitor terminal 506 of the capacitor module 500 through a positive electrode terminal 157. An emitter electrode of the IGBT 330 in lower arm is electrically connected to a negative-electrode-side capacitor terminal 504 of the capacitor module 500 through a negative electrode terminal 158.

The IGBT 328 includes the collector electrode 153, an emitter electrode for a signal 155, and a gate electrode 154. In addition, the IGBT 330 includes a collector electrode 163, an emitter electrode for a signal 165, and a gate electrode 164. The diode 156 is electrically connected between the collector electrode 153 and the emitter electrode. In addition, the diode 166 is electrically connected between the collector electrode 163 and the emitter electrode. As a power semiconductor element for switching, a metal oxide semiconductor field effect transistor (hereinafter, simply referred to as "MOSFET") may be used. In this case, the diode 156 and the diode 166 are unnecessary. As the power semiconductor element for switching, the IGBT is suitable for a case in which the DC voltage is relatively high, and the MOSFET is suitable for a case in which the DC voltage is relatively low.

The capacitor module 500 includes a plurality of positive-electrode-side capacitor terminals 506, a plurality of negative-electrode-side capacitor terminals 504, a positive-electrode-side power supply terminal 509, and a negative-electrode-side power supply terminal 508. High-voltage DC power from the battery 136 is supplied to the positive-electrode-side power supply terminal 509 or the negative-electrode-side power supply terminal 508 through the DC connector 138. The supplied DC power is supplied from the plurality of positive-electrode-side capacitor terminals 506 or the plurality of negative-electrode-side capacitor terminals 504 of the capacitor module 500 to the inverter circuit 140, the inverter circuit 142, or the power module for auxiliary machinery 350. On the other hand, DC power, which is converted from AC power by the inverter circuit 140 or the inverter circuit 142, is supplied from the positive-electrode-side capacitor terminals 506 or the negative-electrode-side capacitor terminals 504 to the capacitor module 500, and is supplied from the positive-electrode-side power supply terminal 509 or the negative-electrode-side power supply terminal 508 to the battery 136 through the DC connector 138 and is stored in the battery 136.

The control circuit 172 includes a microcomputer (hereinafter, referred to as a "microcomputer") for arithmetic processing of a switching timing of the IGBT 328 and the IGBT 330. As input information into the microcomputer, a target torque value that is demanded for the motor generator MG1, a current value that is supplied from the upper and lower arm series circuit 150 to the motor generator MG1, and a magnetic pole position of a rotator of the motor generator MG1. The target torque value is based on a command signal that is output from an upper-layer control device (not illustrated). The current value is detected on the basis of a signal detected by a current sensor 180. The magnetic pole position is detected on the basis of a detection signal that is output from a rotary magnetic pole sensor (not illustrated) such as a resolver that is provided to the motor generator MG1. In this embodiment, description is made with respect to a case where the current sensor 180 detects a three-phase current value as an example, but a current value for two phases may be detected, or a current for three phases may be obtained by arithmetic processing.

FIG. 3 illustrates an exploded perspective view of the electric power converter 200 as an embodiment of the invention. The electric power converter 200 includes power semiconductor modules 300a to 300c and power semiconductor modules 301a to 301c which will be described later, a flow channel forming body 12 which functions as a case in which the capacitor module 500 is stored and forms a flow channel, and a cover 8. In addition, a case body may be provided independently from the flow channel forming body 12 of this embodiment, and the flow channel forming body 12 may be configured to be stored in the case.

The cover 8 stores circuit components which constitute the electric power converter 200, and is fixed to the flow channel forming body 12. A control circuit substrate 20 on which the control circuit 172 is mounted is disposed at an upper portion inside the cover 8. A first opening 202, a third opening 204a, a fourth opening 204b, and a fifth opening 205 are provided in an upper surface of the cover 8. In addition, a second opening 203 is provided in a side wall of the cover 8.

The connector 21 is provided to the control circuit substrate 20 and protrudes to the outside through the first opening 202. A negative-electrode-side electric power line 510 and a positive-electrode-side electric power line 512 electrically connect the DC connector 138, the capacitor module 500, and the like, and protrude to the outside through the third opening 203.

AC-side relay conductors 802a to 802c are connected to power semiconductor modules 300a to 300c, and protrude to the outside through the third opening 204a. AC-side relay conductors 802d to 802f are connected to the power semiconductor modules 301a to 301c, and protrude to the outside through the fourth opening 204b. An alternating current output terminal (not illustrated) of the power module for auxiliary machinery 350 protrudes to the outside through the fifth opening 205.

A direction of a fitting surface of a terminal such as the connector 21 is different depending on the type of vehicles. However, in a case of mounting the terminal, particularly, on a small-sized vehicle, it is preferable that the fitting surface is formed to face an upward direction from the viewpoints of restriction in a size inside an engine room or ease of assembly. For example, in a case where the electric power converter 200 is disposed on an upper side of the transmission TM, when the electric power converter 200 is made to protrude toward a side opposite to a side in which the transmission TM is disposed, workability is improved.

In addition, the cover 8 is formed from a metal, and functions as a case in which the power semiconductor modules 300a to 300c, and 301a to 301c, a driver circuit substrate 22, a control circuit substrate 20, and a metal base plate 11 are stored.

In addition, the connector 21 protrudes to the outside of the cover 8 from a storage space of the cover 8 through the first opening 212. According to this, the control circuit substrate 20 on which the connector 21 is mounted is attached onto the metal base plate 11. Accordingly, even when a physical force is applied to the connector 21 from the outside, a load on the control circuit substrate 20 is suppressed, and thus reliability including durability can be improved.

A metal supporting member 803 protrudes from the flow channel forming body 12 and is connected to the flow channel forming body 12. The metal base plate 11 is supported to the tip end portion of the supporting member 803.

FIG. 4 is an entire exploded perspective view for easy comprehension of a configuration of being stored inside the flow channel forming body 12 of the electric power converter 200.

The flow channel forming body 12 forms openings 400a to 400c, and openings 402a to 402c which are connected to a flow channel through which a cooling refrigerant flows. The openings 400a to 400c are clogged by the power semiconductor modules 300a to 300c which are inserted therethrough, and openings 402d to 402f are clogged by the power semiconductor modules 301a to 301c which are inserted therethrough.

The flow channel forming body 12 forms a storage space 405, in which the capacitor module 500 is stored, on a lateral portion of the space in which the power semiconductor modules 300a to 300c and the power semiconductor modules 301a to 301c are stored.

The capacitor module 500 is spaced from the power semiconductor modules 300a to 300c, and the power semiconductor modules 301a to 301c at an approximately constant distance. Accordingly, a circuit constant between a smoothing capacitor and a power semiconductor module circuit tends to be balanced at three respective phases, and thus a circuit configuration capable of easily reducing a spike voltage is obtained.

When a main structure of the flow channel of the flow channel forming body 12 is formed integrally with the flow channel forming body 12 through aluminum material casting, it is possible to make the mechanical strength of the flow channel strong in addition to improvement in a cooling effect. In addition, when being manufactured through the aluminum casting, the flow channel forming body 12 and the flow channel has an integral structure, and thus thermal conduction is improved, and cooling efficiency is improved. In addition, the power semiconductor modules 300a to 300c and the power semiconductor modules 301a to 301c are fixed to the flow channel to complete the flow channel, and then a water leakage test is performed on a water channel. When passing the water leakage test, a subsequent process of attaching the capacitor module 500, the power module for auxiliary machinery 350, or the substrate can be performed. In this manner, the flow channel forming body 12 is disposed at the bottom portion of the electric power converter 200, and then processes of fixing necessary components such as the capacitor module 500, the power module for auxiliary machinery 350, and the substrate can be sequentially performed from an upper side, and thus productivity and reliability are improved.

The driver circuit substrate 22 is disposed on an upper side of the power semiconductor modules 300a to 300c, the power semiconductor modules 301a to 301c, and the capacitor module 500. In addition, the metal base plate 11 is disposed between the driver circuit substrate 22 and the control circuit substrate 20. The metal base plate 11 exhibits an electromagnetic shield function of a circuit group that is mounted on the driver circuit substrate 22 and the control circuit substrate 20, and has a function of cooling the driver circuit substrate 22 and the control circuit substrate 20 by emitting heat that is generated therein.

In addition, the metal base plate 11 has a function of raising a mechanical resonance frequency of the control circuit substrate 20. That is, a screwing portion that fixes the control circuit substrate 20 to the metal base plate 11 can be arranged in a short interval. Accordingly, in a case where mechanical vibration occurs, it is possible to make a distance between supporting points small, and thus it is possible to raise a resonance frequency. For example, it is possible to raise a resonance frequency of the control circuit substrate 20 against a vibration frequency that is transmitted from the transmission, and thus it is less likely to be susceptible to an effect of the vibration. Accordingly, reliability is improved.

FIG. 5 is a view illustrating the flow channel forming body 12, and is a view when viewing the flow channel forming body 12 illustrated in FIG. 4 from a lower side.

The flow channel forming body 12 is provided with an inlet pipe 13 and an outlet pipe 14 on one side wall 12a. A cooling refrigerant flows-in in a direction of a flow direction 417 indicated by a dotted line, and flows through a first flow channel portion 19a that is formed along one side of the flow channel forming body 12 after passing through the inlet pipe 13. A second flow channel portion 19b is connected to the first flow channel portion 19a through a bent flow channel portion, and is formed in parallel with the first flow channel portion 19a. A third flow channel portion 19c is connected to the second flow channel portion 19b through a bent flow channel portion, and is formed in parallel with the second flow channel portion 19b. A fourth flow channel portion 19d is connected the third flow channel portion 19c through a bent flow channel portion, and is formed in parallel with the third flow channel portion 19c. A fifth flow channel portion 19e is connected to the fourth flow channel portion 19d through a bent flow channel portion, and is formed in parallel with the fourth flow channel portion 19d. A sixth flow channel portion 19f is connected to the fifth flow channel portion 19e through a bent flow channel portion, and is formed in parallel with the fifth flow channel portion 19e. That is, the first flow channel portion 19a to the sixth flow channel portion 19f form a zigzag flow channel that is connected as one flow channel.

A first flow channel forming body 441 forms the first flow channel portion 19a, the second flow channel portion 19b, the third flow channel portion 19c, the fourth flow channel portion 19d, the fifth flow channel portion 19e, and the sixth flow channel portion 19f. The first flow channel portion 19a, the second flow channel portion 19b, the third flow channel portion 19c, the fourth flow channel portion 19d, the fifth flow channel portion 19e, and the sixth flow channel portion 19f are formed with dimensions in which a dimension in a depth direction is greater than a dimension in a width direction.

A seventh flow channel portion 19g is connected to the sixth flow channel portion 19f, and is formed at a position that faces the storage space 405 of the capacitor module 500 illustrated in FIG. 4. A second flow channel forming body 442 forms the seventh flow channel portion 19g. The seventh flow channel portion 19g is formed with dimensions in which a dimension in a width direction is greater than a dimension in a depth direction.

An eighth flow channel portion 19h is connected to the seventh flow channel portion 19g, and is formed at a position that faces the power module for auxiliary machinery 350 to be described later. In addition, the eighth flow channel portion 19h is connected to the outlet pipe 14. A third flow channel forming body 444 forms the eighth flow channel portion 19h. The eighth flow channel portion 19h is formed with dimensions in which a dimension in a depth direction is greater than a dimension in a width direction.

An opening 404, which is continuously formed as one opening, is formed on a bottom surface of the flow channel forming body 12. The opening 404 is closed by a lower cover 420. A sealing member 409 is provided between the lower cover 420 and the flow channel forming body 12 to maintain air-tightness.

In addition, convex portions 406a to 406f, which protrude toward a direction to be distant from the flow channel forming body 12, are formed on the lower cover 420. The convex portions 406a to 406f are provided in correspondence with the power semiconductor modules 300a to 300c, and the power semiconductor modules 301a to 301c. That is, the convex portion 406a is formed to face the first flow channel portion 19a. The convex portion 406b is formed to face the second flow channel portion 19b. The convex portion 406c is formed to face the third flow channel portion 19c. The convex portion 406d is formed to face the fourth flow channel portion 19d. The convex portion 406e is formed to face the fifth flow channel portion 19e. The convex portion 406f is formed to face the sixth flow channel portion 19f.

The depth and width of the seventh flow channel portion 19g are greatly changed from the depth and width of the sixth flow channel portion 19f. It is preferable that the second flow channel forming body 442 is provided with a straight fin 447 that protrudes toward the seventh flow channel portion 19g for management of rectification of a cooling medium and a flow rate through a large change in a shape of the flow channel.

Similarly, the depth and width of the eighth flow channel portion 19h are greatly changed from the depth and width of the seventh flow channel portion 19g. It is preferable that the third flow channel forming body 444 is provided with a straight fin 448 that protrudes toward the eighth flow channel portion 19h for management of rectification of a cooling refrigerant and a flow rate through a large change in a shape of the flow channel.

A detailed configuration of the power semiconductor modules 300a to 300c, and the power semiconductor modules 301a to 301c which are used in the inverter circuit 140 will be described with reference to FIGS. 6 to 10. All of the power semiconductor modules 300a to 300c, and the power semiconductor modules 301a to 301c have the same structure, and thus the structure of the power semiconductor module 300a will be described as a representative example. However, in FIG. 6 to FIG. 10, a signal terminal 325U corresponds to the gate electrode 154 and the emitter electrode for a signal 155 which are illustrated in FIG. 2, and a signal terminal 325L corresponds to the gate electrode 164 and the emitter electrode 165 which are illustrated in FIG. 2. In addition, a DC positive electrode terminal 315B is the same as the positive electrode terminal 157 illustrated in FIG. 2, and a DC negative electrode terminal 319B is the same as the negative electrode terminal 158 illustrated in FIG. 2. In addition, an AC terminal 320B is the same as the intermediate electrode 168 illustrated in FIG. 2.

FIG. 6(a) is a perspective view of the power semiconductor module 300a of this embodiment. FIG. 6(b) is a cross-sectional view when the power semiconductor module 300a of this embodiment is cut out along a cross-section D and is viewed from a direction E.

FIG. 7 is a view illustrating the power semiconductor module 300a from which a screw 309 and a second sealing resin 351 are removed from a state illustrated in FIG. 6 for easy comprehension. FIG. 7(a) is a perspective view, and FIG. 7(b) is a cross-sectional view which is taken along the cross-section D and is viewed from a direction E similar to FIG. 6(b). In addition, FIG. 7(c) illustrates a cross-sectional view before the fin 305 is pressed and a thin portion 304A is deformed.

FIG. 8 is a view illustrating the power semiconductor module 300a from which a module case 304 is further removed from a state illustrated in FIG. 7. FIG. 8(a) is a perspective view, and FIG. 8(b) is a cross-sectional view which is taken along the cross-section D and is viewed from the direction E similar to FIG. 6(b) and FIG. 7(b).

FIG. 9 is a perspective view of the power semiconductor module 300a from which a first sealing resin 348 and an interconnection insulating portion 608 are further removed from a state illustrated in FIG. 8.

FIG. 10 is a view illustrating a process of assembling a primary module sealing body 302.

As illustrated in FIG. 8 and FIG. 9, power semiconductor elements (the IGBT 328, the IGBT 330, the diode 156, and the diode 166), which constitute the upper and lower arm series circuit 150, are fixed by a conductor plate 315 and a conductor plate 318, or a conductor plate 320 or a conductor plate 319 with the power semiconductor elements interposed therebetween from both surfaces thereof. The conductor plate 315 and the like are sealed by the first sealing resin 348 in a state in which a heat radiating surface is exposed, and an insulating member 333 is thermally compressed to the heat radiating surface. As illustrated in FIG. 8, the first sealing resin 348 has a polyhedral shape (here, an approximately rectangular parallelepiped shape).

The primary module sealing body 302 that is sealed by the first sealing resin 348 is inserted to the inside of the module case 304, and is thermally compressed to an inner surface of the module case 304, which is a CAN type cooler, with the insulating member 333 interposed between the primary module sealing body 302 and the module case 304. Here, the CAN type cooler is a tubular cooler that has an insertion port 306 in one surface, and a bottom on the other surface. A void inside the module case 304 is filled with the second sealing resin 351.

The module case 304 is configured of an electrically conductive member, for example, an aluminum alloy material (Al, AlSi, AlSiC, Al—C, and the like). The outer periphery of the insertion port 306 is surrounded by a flange 304B. In addition, as illustrated in FIG. 6(a), a first radiating surface 307A and a second radiating surface 307B, which are wider than the other surfaces, are disposed to be opposite to each other, and the respective power semiconductor elements (the IGBT 328, the IGBT 330, the diode 156, and the diode 166) are disposed to face the respective radiating surfaces.

Three surfaces, which are connected to the opposite first and second radiating surfaces 307A and 307B, constitute closed surfaces with a width narrower than that of the first radiating surface 307A and the second radiating surface 307B, and the insertion port 306 is formed in the remaining one surface. It is not necessary for the shape of the module case 304 to be a correct rectangular parallelepiped shape, and corners may form a curved surface as illustrated in FIG. 6(a).

When using the metal case having the above-described shape, even though the module case 304 is inserted into a flow channel through which a refrigerant such as water and an oil flows, sealing against the refrigerant can be secured with the flange 304B, and thus it is possible to prevent the cooling refrigerant from intruding into the inside of the module case 304 with a simple configuration. In addition, the fin 305 is uniformly formed in the first radiating surface 307A and the second radiating surface 307B which are opposite to each other. In addition, the thin portion 304A, which has a very small thickness, is formed at the outer periphery of the first radiating surface 307A and the second radiating surface 307B. The thin portion 304A is formed to have a very small thickness to a certain extent capable of being simply deformed when being compressed by the fin 305, and thus productivity after insertion of the primary module sealing body 302 is improved.

As described above, when the conductor plate 315 and the like are thermally compressed to an inner wall of the module case 304 through the insulating member 333, it is possible to make a void between the conductor plate 315 and the like, and the inner wall of the module case 304 small, and thus it is possible to transfer heat generated in the power semiconductor elements to the fin 305 with efficiency. Furthermore, when the insulating member 333 is made to have a thickness and flexibility to a certain extent, occurrence of a thermal stress can be absorbed by the insulating member 333, and thus the electric power converter can be used as an electric power converter for a vehicle, in which a variation in a temperature is great, in a satisfactory manner.

A DC positive electrode interconnection 315A and a DC negative electrode interconnection 319A, which are electrically connected to the capacitor module 500 and which are formed from a metal, are provided at the outside of the module case 304, and at tip end portions thereof, a DC positive electrode terminal 315B and a DC negative electrode terminal 319B are respectively formed. In addition, an AC interconnection 320A, which supplies AC power to the motor generator MG1 or MG2 and which is formed from a metal, is formed, and an AC terminal 320B is formed at the tip end portion thereof. In this embodiment, as illustrated in FIG. 9, the DC positive electrode interconnection 315A is connected to the conductor plate 315, the DC negative electrode interconnection 319A is connected to the conductor plate 319, and the AC interconnection 320A is connected to the conductor plate 320.

At the outside of the module case 304, signal interconnections 324U and 324L, which are formed from a metal and are electrically connected to the driver circuit 174, are provided, and the signal terminal 325U and the signal terminal 325L are formed at the tip end portions thereof, respectively. In this embodiment, as illustrated in FIG. 9, the signal interconnection 324U is connected to the IGBT 328, and the signal interconnection 324L is connected to the IGBT 328.

The DC positive electrode interconnection 315A, the DC negative electrode interconnection 319A, the AC interconnection 320A, the signal interconnection 324U, and the signal interconnection 324L are integrally formed as an auxiliary molded body 600 in a state of being insulated from each other with an interconnection insulating portion 608 formed from a resin material. The interconnection insulating portion 608 operates as a supporting member that supports the respective interconnections, and as the resin material that is used, a thermosetting resin or a thermoplastic resin which has insulating properties is suitable. According to this, it is possible to secure insulating properties between the DC positive electrode interconnection 315A, the DC negative electrode interconnection 319A, the AC interconnection 320A, the signal interconnection 324U, and the signal interconnection 324L, and thus high-density interconnection is possible.

After being metal-bonded to the primary module sealing body 302 at a connection portion 370, the auxiliary molded body 600 is fixed to the module case 304 with the screw 309 that passes through a screw hole provided in the interconnection insulating portion 608. For the metal bonding between the primary module sealing body 302 and the auxiliary molded body 600 at the connection portion 370, for example, TIG welding and the like can be used.

The DC positive electrode interconnection 315A and the DC negative electrode interconnection 319A are laminated on each other in a state of facing each other with the interconnection insulating portion 608 interposed therebetween, and have shapes that extend approximately in parallel with each other. According to the disposition and shapes, an inrush current during the switching operation of the power semiconductor elements flows in opposite directions. According to this, an operation, in which magnetic fields formed by the current cancel each other, is obtained, and according to this operation, low inductance is realized. In addition, the AC interconnection 320A, and the signal terminals 325U and 325L extend in the same direction as in the DC positive electrode interconnection 315A and the DC negative electrode interconnection 319A.

The connection portion 370 at which the primary module sealing body 302 and the auxiliary molded body 600 are connected to each other through the metal bonding is sealed in the module case 304 with the second sealing resin 351. According to this, an insulating distance necessary between the connection portion 370 and the module case 304 can be reliably secured, and thus miniaturization of the power semiconductor module 300a can be realized in comparison to a case where sealing is not performed.

As illustrated in FIG. 9, an auxiliary-module-side DC positive electrode connection terminal 315C, an auxiliary-module-side DC negative electrode connection terminal 319C, an auxiliary-module-side AC connection terminal 320C, an auxiliary-module-side signal connection terminal 326U, and an auxiliary-module-side signal connection terminal 326L are arranged in a row on an auxiliary module 600 side of the connection portion 370. On the other hand, an element-side DC positive electrode connection terminal 315D, an element-side DC negative electrode connection terminal 319D, an element-side AC connection terminal 320D, an element-side signal connection terminal 327U, and an element-side signal connection terminal 327L are arranged in a row on a primary module sealing body 302 side of the connection portion 370 along one surface of the first sealing resin 348 having a polyhedral shape. According to the structure in which the respective terminals are arranged in a row at the connection portion 370, it is easy to manufacture the primary module sealing body 302 with a transfer mold.

Here, description will be made with respect to a positional relationship between the respective terminals when a portion of the primary module sealing body 302, which extends from the first sealing resin 348 to the outside, is regarded as one terminal for each type. In the following description, terminals, which include the DC positive electrode interconnection 315A (including the DC positive electrode terminal 315B and the auxiliary-module-side DC positive electrode connection terminal 315C), and the element-side DC positive electrode connection terminal 315D, are referred to as positive-electrode-side terminals. Terminals, which include the DC negative electrode interconnection 319A (including the DC negative electrode terminal 319B and the auxiliary-module-side DC negative electrode connection terminal 319C), and the element-side DC negative electrode connection terminal 315D, are referred to as negative-electrode-side terminals. Terminals, which include the AC interconnection 320A (including the AC terminal 320B and the auxiliary-module-side AC connection terminal 320C), and the element-side AC connection terminal 320D, are referred to as output terminals. Terminals, which include the signal interconnection 324U (including the signal terminal 325U and the auxiliary-module-side signal connection terminal 326U), and the element-side signal connection terminal 327U, are referred to as signal terminals for an upper arm. Terminals, which include the signal interconnection 324L (including the signal terminal 325L and the auxiliary-module-side signal connection terminal 326L), and the element-side signal connection terminal 327L, are referred to as signal terminals for a lower arm.

The respective terminals protrude from the first sealing resin 348 and the second sealing resin 351 through the connection portion 370. Respective protruding portions (the element-side DC positive electrode connection terminal 315D, the element-side DC negative electrode connection terminal 319D, the element-side AC connection terminal 320D, the element-side signal connection terminal 327U, and the element-side signal connection terminal 327L) from the first sealing resin 348 are arranged in a row along one surface of the first sealing resin 348 having a polyhedral shape as described above. In addition, the positive-electrode-side terminals and the negative-electrode-side terminals protrude from the second sealing resin 351 in a laminated state, and extend to the outside of the module case 304. According to this configuration, when sealing the power semiconductor elements with the first sealing resin 348 to manufacture the primary module sealing body 302, during mold clamping, it is possible to prevent excessive stress being applied to a connection portion between the power semiconductor elements and the terminals or it is possible to prevent a gap from occurring in molds. In addition, magnetic fluxes in directions of canceling each other are generated due to currents which flow through the laminated positive-electrode-side terminals and the negative-electrode-side terminals in opposite directions, and thus low inductance can be realized.

On an auxiliary module 600 side, the auxiliary-module-side DC positive electrode connection terminal 315C and the auxiliary-module-side DC negative electrode connection terminal 319C are formed at the tip end portions of the DC positive electrode interconnection 315A and the DC negative electrode interconnection 319A which are opposite to the DC positive electrode terminal 315B and the DC negative electrode terminal 319B. In addition, the auxiliary-module-side AC connection terminal 320C is formed at the tip end portion of the AC interconnection 320A which is opposite to the AC terminal 320B. The auxiliary-module-side signal connection terminals 326U and 326L are formed at the tip end portions of the signal interconnections 324U and 324L which are opposite to the signal terminals 325U and 325L.

On the other hand, on a primary module sealing body 302 side, the element-side DC positive electrode connection terminal 315D, the element-side DC negative electrode connection terminal 319D, and the element-side AC connection terminal 320D are formed in the conductor plates 315, 319, and 320, respectively. In addition, the element-side signal connection terminals 327U and 327L are respectively connected to the IGBT 328 and IGBT 330 by a bonding wire 371.

As illustrated in FIG. 10, the DC positive-electrode-side conductor plate 315, the AC output-side conductor plate 320, and the element-side signal connection terminals 327U and 327L are integrally processed to realize arrangement in approximately the same planar shape in a state of being connected to a common tie-bar 372. A collector electrode of the IGBT 328 on an upper arm side and a cathode electrode of the diode 156 on an upper arm side are fixed to the conductor plate 315. A collector electrode of the IGBT 330 on a lower arm side and a cathode electrode of the diode 166 on a lower arm side are fixed to the conductor plate 320. The conductor plate 318 and the conductor plate 319 are disposed on the IGBT 328, the IGBT 330, and the diodes 155 and 166 in approximately the same planar shape. An emitter electrode of the IGBT 328 on an upper arm side and an anode electrode of the diode 156 on an upper arm side are fixed to the conductor plate 318. An emitter electrode of the IGBT 330 on a lower arm side and an anode electrode of the diode 166 on a lower arm side are fixed to the conductor plate 319. Each of the power semiconductor elements is fixed to an element fixing portion 322, which is provided to each of the conductor plates, through a metal bonding material 160. Examples of the metal bonding material 160 include a solder material, a silver sheet, a low-temperature sintering bonding material including fine metal particles, and the like.

Each of the power semiconductor elements has a plate-shaped flat structure, and respective electrodes of the power semiconductor element are formed on front and rear surfaces. As illustrated in FIG. 10, the respective electrodes of the power semiconductor element are interposed between the conductor plate 315 and the conductor plate 318, or between the conductor plate 320 and the conductor plate 319. That is, the conductor plate 315 and the conductor plate 318 are laminated to face each other through the IGBT 328 and the diode 156 in an approximately parallel direction. Similarly, the conductor plate 320 and the conductor plate 319 are laminated to face each other through the IGBT 330 and the diode 166 in an approximately parallel direction. In addition, the conductor plate 320 and the conductor plate 318 are connected to each other through an intermediate electrode 329. According to this connection, an upper-arm circuit and a lower-arm circuit are electrically connected to each other, and thus an upper and lower arm series circuit is formed. As described above, the IGBT 328 and the diode 156 are pinched between the conductor plate 315 and the conductor plate 318, the IGBT 330 and the diode 166 are pinched between the conductor plate 320 and the conductor plate 319, and the conductor plate 320 and the conductor plate 318 are connected to each other through the intermediate electrode 329. Then, a control electrode 328A of the IGBT 328 and the element-side signal connection terminal 327U are connected to each other by the bonding wire 371, and a control electrode 330A of the IGBT 330 and the element-side signal connection terminal 327L are connected to each other by the bonding wire 371.

FIG. 11(a) is an exploded perspective view illustrating an internal structure of the capacitor module 500. A laminated conductor plate 501 is constituted by a negative electrode conductor plate 505 and a positive electrode conductor plate 507 which are configured of a plate-shaped wide conductor, and an insulating sheet (not illustrated) that is interposed between the negative electrode conductor plate 505 and the positive electrode conductor plate 507. In the laminated conductor plate 501, with regard to a current which flows through the upper and lower arm series circuit 150 of the respective phases, magnetic fluxes cancel each other, and thus low inductance is realized with respect to the current that flows through the upper and lower arm series circuit 150.

The negative-electrode-side power supply terminal 508 and the positive-electrode-side power supply terminal 509 are formed in a state of being erected from one side of the laminated conductor plate 501 in a longitudinal direction. The negative-electrode-side power supply terminal 508 is connected to the negative electrode conductor plate 505. The positive-electrode-side power supply terminal 509 is connected to the positive electrode conductor plate 507. Capacitor terminals for auxiliary machinery 516 and 517 are formed in a state of being erected from the one side of the laminated conductor plate 501 in the longitudinal direction. The capacitor terminal for auxiliary machinery 516 is connected to the positive electrode conductor plate 507. The capacitor terminal for auxiliary machinery 517 is connected to the negative electrode conductor plate 505.

A relay conductor portion 530 is formed in a state of being erected from the other side of the laminated conductor plate 501 in the longitudinal direction. Capacitor terminals 503a to 503c protrude from an end of the relay conductor portion 530, and are formed in correspondence with the respective power semiconductor modules 300a to 300c. In addition, capacitor terminals 503d to 503f protrude from an end of the relay conductor portion 530, and are formed in correspondence with the respective power semiconductor modules 301d to 301f. The relay conductor portion 530 and the capacitor terminals 503a to 503f are laminated with an insulating sheet (not illustrated) interposed therebetween, and thus low inductance is realized with respect to a current which flows through the upper and lower arm series circuit 150. In addition, the relay conductor portion 530 has a configuration in which through-holes which hinder flowing of a current, and the like are not formed, or the through-holes and the like are decreased.

According to this configuration, a backflow current, which is generated during switching between the power semiconductor modules 300a to 300c provided for respective phases, tends to flow through the relay conductor portion 530, and is less likely to flow toward the laminated conductor plate 501 side. Accordingly, it is possible to reduce heat generation at the laminated conductor plate 501 due to the backflow current. The laminated conductor plate 501 is provided in a region that faces a capacitor cell 514, and reduction in the heat generation at the laminated conductor plate 501 leads to reduction in a thermal effect on the capacitor cell 514.

In addition, in this embodiment, the negative electrode conductor plate 505, the positive electrode conductor plate 507, the battery-negative-electrode-side terminal 508, the battery-positive-electrode-side terminal 509, the relay conductor portion 530, and the capacitor terminals 503a to 503f are configured of a metal plate that is integrally formed, and have an effect of reducing inductance with respect to a current which flows through the upper and lower arm series circuit 150.

A base plate 550 is disposed between the laminated conductor plate 501 and the capacitor cell 514 to be approximately parallel with the laminated conductor plate 501. A through-hole 556 is provided in the base plate 550 in order for a lead 560, which is configured to electrically connect the laminated conductor plate 501 and the capacitor cell 514 in the shortest distance, to penetrate through the base plate 550. Insulation between the through-hole 556 and the lead 560 can be secured by a creeping distance after sealing with a resin, or can be realized by a method of enclosing an edge of the through-hole 556 with an insulating material (not illustrated) in advance, and allowing the lead 560 to pass through the through-hole 556.

The base plate 550 is disposed to be close to the laminated conductor plate 501 so as to radiate of Joule heat of the laminated conductor plate 501, the relay conductor portion 530, and the capacitor terminals 503a to 503f to the flow channel forming body 12. In a case where insulation with the sealing resin, which fills a gap at which the base plate 550 and the laminated conductor plate 501 face each other, is not sufficient, an insulating sheet (not illustrated) may be interposed in the gap. It is not necessary for the base plate 550 and the capacitor cell 514 to be thermally close to each other. However, in a case where the lead 560 is made to be short to reduce impedance, an insulating sheet (not illustrated) may be interposed between the base plate 550 and the capacitor cell 514.

The base plate 550 has a positioning structure with respect to the flow channel forming body 12. The position of the capacitor module 500 is determined by the positioning structure, and the base plate 550 is fixed to the flow channel forming body 12.

In this embodiment, the base plate 550 has not only a positioning hole 552a on one short-side side of the capacitor module 500, but also a positioning hole 552b (not illustrated) on the other short-side side thereof which is opposite to the one short-side side. When protrusions, which are provided to the flow channel forming body 12, are inserted into the positioning holes 552a and 552b, the base plate 550 is fixed to the flow channel forming body 12.

In addition, the base plate 550 also has a positioning structure with respect to a capacitor case 502. The base plate 550 has not only a positioning hole 551a on one short-side side of the capacitor module 500, but also a positioning hole 551b (not illustrated) on the other short-side side thereof which is opposite to the one short-side side. A positioning protrusion 522a that is formed on one short side of the capacitor case 502 is fitted into the positioning hole 551a. A positioning protrusion 522b (not illustrated) that is formed on the other short side of the capacitor case 502 is fitted into the positioning hole 551b.

In addition, the base plate 550 also has a positioning structure with respect to the laminated conductor plate 501. The base plate 550 has positioning holes 558a and 558b in a surface that faces the laminated conductor plate 501. Positioning clips 554a and 554b are fixed to the positioning holes 558a and 558b from respective upper sides of the positioning holes 558a and 558b in order for the laminated conductor plate 501 to be pinched by the base plate 550. The structure of the positioning clips 554a and 554b will be described later with reference to FIGS. 11(c) and (d).

A plurality of the capacitor cells 514 are provided on a lower side of the laminated conductor plate 501. In this embodiment, three capacitor cells 514 are arranged in a row along one side of the laminated conductor plate 501 in the longitudinal direction thereof. In addition, other three capacitor cells 514 are arranged in a row along the other side of the laminated conductor plate 501 in the longitudinal direction thereof. That is, in this embodiment, a total of six capacitor cells are provided.

The capacitor cells 514, which are arranged along respective sides of the laminated conductor plate 501 in the longitudinal direction, are arranged to be symmetrical about a dotted line A-A illustrated in FIG. 11(a). According to this, in a case of supplying a DC current, which is smoothed by the capacitor cells 514, to the power semiconductor modules 300a to 300c, and the power semiconductor modules 301a to 301c, a current balance between the capacitor terminals 503a to 503c, and the capacitor terminals 503d to 503f becomes uniform, and thus it is possible to reduce inductance of the laminated conductor plate 501. In addition, it is possible to prevent a current from locally flowing through the laminated conductor plate 501, and thus heat balance becomes uniform. As a result, it is also possible to improve a heat resistance.

Each of the capacitor cells 514 is a unit structure body of an electricity storage unit of the capacitor module 500, and as the capacitor cell 514, a film capacitor, which is obtained by laminating two sheets of films in which a metal such as aluminum is deposited on one surface and by winding the sheets, is used. In the film capacitor, the two sheets of metals are set as a positive electrode and a negative electrode, respectively. With regard to the electrodes of the capacitor cell 514, wound axial surfaces become a positive electrode and a negative electrode, respectively, and the electrodes are manufactured by attaching a conductive body such as zinc to the axial surfaces.

The capacitor case 502 includes a storage portion 511 in which the capacitor cell 514 is stored. An upper surface and a lower surface of the storage portion 511 have an approximately rectangular shape. The capacitor case 502 is provided with a fixing unit that fixes the capacitor module 500 to the flow channel forming body 12. As the fixing unit, for example, holes 520a to 520h through which a screw passes are provided. The capacitor case 502 of this embodiment is constituted by a resin with high thermal conductivity so as to improve thermal conductivity, but may be constituted by a metal and the like.

In addition, after the laminated conductor plate 501 and the capacitor cell 514 are stored in the capacitor case 502, the inside of the capacitor case 502 is filled with a filling material (not illustrated) to cover the laminated conductor plate 501 except for the capacitor terminals 503a to 503f, the negative-electrode-side power supply terminal 508, and the positive-electrode-side power supply terminal 509.

In addition, the capacitor cell 514 generates heat by electrical resistance in a metal thin film deposited on an internal film, or an internal conductor due to a ripple current during switching. Accordingly, the capacitor cell 514 is molded with a filling material so as to easily radiate the heat in the capacitor cell 514 through the capacitor case 502. In addition, when using a resin filling material, humidity resistance of the capacitor cell 514 can be improved.

A capacitor cell for a noise filter 515a is connected to the positive electrode conductor plate 507, and removes a predetermined noise that occurs between a positive electrode and a ground. A capacitor cell for a noise filter 515b is connected to the negative electrode conductor plate 505, and removes a predetermined noise that occurs between a negative electrode and a ground. The capacitor cells for a noise filter 515a and 515b are set to have capacity that is smaller than that of the capacitor cell 514.

In addition, the capacitor cells for a noise filter 515a and 515b are disposed to be closer to the negative-electrode-side power supply terminal 508 and the positive-electrode-side power supply terminal 509 in relation to the capacitor terminals 503a to 503f. According to this, it is possible to remove a predetermined noise that is mixed into the negative-electrode-side power supply terminal 508 and the positive-electrode-side power supply terminal 509 at an earlier time, and thus it is possible to reduce an effect of a noise on the power semiconductor modules. The capacitor cells for a noise filter 515a and 515b are sealed with the filling material that fills the inside of the capacitor case 502.

In addition, the capacitor cells for a noise filter 515a and 515b have a role of a current path which returns the noise, which is caused by the AC current and occurs in the electric power converter 200, to a high-voltage circuit, that is, the laminated conductor plate 501. The capacitor cells for a noise filter 515a and 515b are connected to the base plate 550 in a short distance through a lead 561. The capacitor cells for a noise filter 515a and 515b are connected to the base plate 550, which is electrically connected to the ground, in the shortest distance, and thus impedance to the ground is lowered, and the effect of returning the noise is improved. As a result, it is possible to realize an improvement in EMC, that is, a reduction in a radiating noise in the electric power converter.

FIG. 11(b) illustrates the disposition of internal components and heat paths 559 and 557 when viewing the capacitor module 500 from a lateral surface on a long-side side.

The base plate 550 is disposed in such a manner that a planar portion thereof faces a planar portion of the laminated conductor plate 501. Joule heat, which is generated in the negative electrode conductor plate 505, the positive electrode conductor plate 507, the battery-negative-electrode-side terminal 508, the battery-negative-electrode-side terminal 509, the relay conductor portion 530, and the capacitor terminals 503a to 503f, is transferred from the entirety of the planar portion of the laminated conductor plate 501 to the entirety of the planar portion of the base plate 550 as illustrated by the heat path 559. The Joule heat that is transferred to the base plate 550 is conducted through the inside the base plate 550, and is transferred to the flow channel forming body 12 as illustrated by the heat path 557. According to this structure, it is possible to reduce reception of the Joule heat in the capacitor cell 514.

As described above, in the electric power converter 200 of this example, the base plate 550 is provided between the capacitor cell 514, and the positive electrode conductor plate 507 and the negative electrode conductor plate 505 in the capacitor module 500, and the through-hole 556, through which the capacitor terminal (lead 560) extending from the capacitor cell 514 passes, is formed in the base plate 550.

As described above, the opening is formed in the base plate. Accordingly, even though the base plate is additionally provided between the capacitor cell and the bus bar, an electrical connection distance between the capacitor cell and the bus bar is suppressed to the minimum, and thus it is possible to prevent an increase in impedance. Furthermore, since the base plate is additionally provided, a heat path, through which heat generated in the bus bar that electrically connects the capacitor cell and the power module is radiated toward the flow channel forming body through the base plate, is formed. Accordingly, heat-reception in a cell of the smoothing capacitor which is caused by heat generation in the bus bar is reduced, and thus it is possible to use the smoothing capacitor in a limitation of maximum using temperature.

FIG. 11(c) is a side view of the positioning clips 554a and 554b. In addition, FIG. 11(d) is a perspective view of the positioning clips 554a and 554b. In FIG. 11(d), the negative electrode conductor plate 505, the positive electrode conductor plate 507, and the base plate 550, which are mounting destinations, are also illustrated.

The positioning clips 554a and 554b are formed from an insulating material. As illustrated in FIG. 11(c), the positioning clips 554a and 554b have three-stage fitting shape so as to correspond to three-stage lamination structure of the negative electrode conductor plate 505, the positive electrode conductor plate 507, and the base plate 550. That is, the positioning clips 554a and 554b include a first stage fitting portion 571, a second stage fitting portion 572, and a third stage fitting portion 573.

The thickness 574 of the first stage fitting portion 571 corresponds to the thickness of the positive electrode conductor plate 507. The thickness 575 of the second stage fitting portion 572 corresponds to a total thickness obtained by adding the thickness of the negative electrode conductor plate 505, and the thickness of an insulating sheet (not illustrated) interposed between the negative electrode conductor plate 505 and the positive electrode conductor plate 507. The thickness 576 of the third stage fitting portion 573 corresponds to a total thickness obtained by adding the thickness of the base plate 550, and the thickness of an insulating sheet (not illustrated) interposed between the negative electrode conductor plate 505 and the base plate 550.

In addition, a stopper 553 is formed at a fourth stage that is a next stage of the third stage fitting portion 573. The stopper 553 is hooked by the base plate 550, and functions as an engagement portion that pinches the base plate 550 in combination with the laminated conductor plate 501.

As illustrated in FIG. 11(d), amounting hole, into which the first stage fitting portion 571 is fitted, is formed in the positive electrode conductor plate 507. A mounting hole, into which the second stage fitting portion 572 is fitted, is formed in the negative electrode conductor plate 505. The positioning holes 558a and 558b, into which third fitting portion 573 is fitted, are formed in the base plate 550. In addition, holes, through which the positioning clips 554a and 554b pass, are also formed in an insulating sheet (not illustrated) interposed between the negative electrode conductor plate 505 and the positive electrode conductor plate 507, or an insulating sheet (not illustrated) interposed between the negative electrode conductor plate 505 and the base plate 550.

The negative electrode conductor plate 505, the positive electrode conductor plate 507, and the base plate 550 are fixed so as to be pinched to each other due to the positioning clips 554a and 554b. That is, the positioning clips 554a and 554b function as a fixing member that fixes the negative electrode conductor plate 505, the positive electrode conductor plate 507, and the base plate 550. As the fixing member, for example, a bolt and a nut, a caulking member, and the like can be used in addition to the clip of this embodiment. According to this, the fixing member fixes the laminated conductor plate 501 and the base plate 550 to each other, and functions as a positioning structure during fixing of the plates 501 and 550. Accordingly, the reliability of the electric power converter is improved. In addition, the positioning becomes easy, and thus this contributes to an improvement in ease of assembly. In addition, the laminated conductor plate 501 is configured to be pinched in combination with the base plate 550, and thus it is easy for heat generated in the laminated conductor plate 501 to be conducted to the base plate 550, and thus a radiation performance is improved.

FIG. 12 is a cross-sectional view of the electric power converter 200 which is taken along a plane A in FIG. 3.

The power semiconductor module 300b is stored in the second flow channel portion 19b illustrated in FIG. 5. An outer wall of the module case 304 comes into direct contact with a cooling refrigerant that flows in the second flow channel portion 19b. The other power semiconductor modules 300a and 300c, and power semiconductor modules 301a to 301c are also stored in respective flow channel portions similar to the power semiconductor module 300b.

The power semiconductor module 300b is disposed on a lateral side of the capacitor module 500. The height 540 of the capacitor module is set to be lower than the height 360 of the power semiconductor module. Here, the height 540 of the capacitor module is a height from the bottom surface of the capacitor case 502 to the capacitor terminal 503b. In addition, the height 360 of the power semiconductor module is the height from the bottom surface of the module case 304 to the tip end of the signal terminal 325U.

In addition, the second flow channel forming body 442 provides the seventh flow channel portion 19g that is disposed on a lower side of the capacitor module 500. That is, the seventh flow channel portion 19g is disposed in parallel with the capacitor module 500 along a height direction of the power semiconductor module 300b. The height 443 of the seventh flow channel portion is lower than a difference between the height 360 of the power semiconductor module and the height 540 of the capacitor module. However, the height 443 of the seventh flow channel portion may be the same as the difference between the height 360 of the power semiconductor module and the height 540 of the capacitor module.

The power semiconductor module 300*b* and the capacitor module 500 are adjacent to each other, and thus a connection distance therebetween is short, and thus low inductance and low loss can be realized.

In addition, a process of fixing and connecting the power semiconductor module 300*b* and the capacitor module 500 can be performed on the same surface, and thus an improvement in ease of assembly can be realized.

In addition, the height 540 of the capacitor module is suppressed to be lower than the height 360 of the power semiconductor module, and thus the seventh flow channel portion 19*g* can be disposed on a lower side of the capacitor module 500, and thus the capacitor module 500 is also cooled down. In addition, the height of an upper portion of the capacitor module 500 and the height of an upper portion of the power semiconductor module 300*b* are different from each other by a close distance, and thus it is possible to suppress the capacitor terminal 503*b* from being lengthening in the height direction of the capacitor module 500.

On the other hand, the seventh flow channel portion 19*g* is disposed on a lower side of the capacitor module 500, and thus a cooling flow channel is prevented from being disposed on a lateral side of the capacitor module 500, and the capacitor module 500 and the power semiconductor module 300*b* are made to be close to each other. Accordingly, it is possible to suppress an increase in an interconnection length between the capacitor module 500 and the power semiconductor module 300*b*.

In addition, a transformer 24 that generates drive power of the driver circuit is mounted on the driver circuit substrate 22. The height of the transformer 24 is set to be higher than the height of circuit components which are mounted on the driver circuit substrate 22. The signal terminal 325U or the DC positive electrode terminal 315B is disposed in a space between the driver circuit substrate 22, and the power semiconductor modules 300*a* to 300*c* and the power semiconductor modules 301*a* to 301*c*. On the other hand, the transformer 24 is disposed in a space between the driver circuit substrate 22 and the capacitor module 500. According to this, it is possible to effectively use the space between the driver circuit substrate 22 and the capacitor module 500. In addition, circuit components whose heights are aligned are mounted on a surface of the driver circuit substrate 22 which is opposite to a surface on which the transformer 24 is disposed, and thus it is possible to suppress a distance between the driver circuit substrate 22 and the metal base plate 11.

The metal supporting member 803 protrudes from the flow channel forming body 12 and is connected to the flow channel forming body 12. The metal base plate 11 is supported to the tip end portion of the supporting member 803. The flow channel forming body 12 is connected to an electrical ground. A flow of a leakage current 804 represents a flow direction of the leakage current that flows from the driver circuit substrate 22 to the metal base plate 11, the supporting member 803, and the flow channel forming body 12 in this order. In addition, a flow of a leakage current 805 represents a flow direction of the leakage current that flows from the control circuit substrate 20 to the metal base plate 11, the supporting member 803, and the flow channel forming body 12 in this order. According to this, it is possible to allow the leakage current of the control circuit substrate 20 and the driver circuit substrate 22 to effectively flow to the ground.

As illustrated in FIG. 3, the control circuit substrate 20 is disposed to face one surface of the cover 8 in which the first opening 202 is formed. In addition, the connector 21 is directly mounted on the control circuit substrate 20 and protrudes to the outside through the first opening 202 formed in the cover 8. According to this, it is possible to effectively use an internal space of the electric power converter 200.

In addition, the control circuit substrate 20 on which the connector 20 is mounted is fixed to a metal base plate 11, and thus even when a physical force is applied to the connector 20 from the outside, a load on the control circuit substrate 20 is suppressed, and thus reliability including durability can be improved.

FIG. 13 is a perspective view in which the cover 8 and the control circuit substrate 20 are removed, and the driver circuit substrate 22 and the metal base plate 11 are exploded.

The driver circuit substrate 22 is disposed on an upper side of the power semiconductor modules 300*a* to 300*c*, and the power semiconductor modules 301*a* to 301*c*. The metal base plate 11 is disposed to be opposite to the power semiconductor modules 300*a* to 300*c* and the power semiconductor modules 301*a* to 301*c* with the driver circuit substrate 22 interposed therebetween.

The driver circuit substrate 22 has a through-hole 22*a* through which the AC-side relay conductor 802*a* passes, a through-hole 22*b* through which the AC-side relay conductor 802*b* passes, a through-hole 22*c* through which the AC-side relay conductor 802*c* passes, a through-hole 22*d* through which the AC-side relay conductor 802*d* passes, a through-hole 22*e* through which the AC-side relay conductor 802*e* passes, and a through-hole 22*f* through which the AC-side relay conductor 802*f* passes.

In addition, a current sensor 180*a* is fitted into the through-hole 22*a*. Similarly, a current sensor 180*b* is fitted into the through-hole 22*b*, a current sensor 180*c* is fitted into the through-hole 22*c*, a current sensor 180*d* is fitted into the through-hole 22*d*, a current sensor 180*e* is fitted into the through-hole 22*e*, and a current sensor 180*f* is fitted into the through-hole 22*f*. However, it is not necessary for a current sensor to be provided to all of the through-holes 22*a* to 22*f*.

When the through-holes 22*a* to 22*f* are provided to the driver circuit substrate 22, it is possible to directly dispose the current sensors to the driver circuit substrate 22, and it is possible to make interconnection of the AC-side relay conductors 802*a* to 802*f* simple, and thus this contributes to miniaturization.

In addition, the current sensors 180*a* to 180*f* are disposed at a space between the driver circuit substrate 22 and the power semiconductor modules 300*a* to 300*c* and the power semiconductor modules 301*a* to 301*c*. The power semiconductor modules 300*a* to 300*c* and the power semiconductor modules 301*a* to 301*c* include the DC positive electrode terminal 315B and the like, and thus it is necessary for the DC positive electrode terminal 315B and the like to secure a sufficient insulating distance with the driver circuit substrate 22. The current sensor 180*a* and the like are disposed in a space for securement of the insulating distance, and thus the space inside the electric power converter can be commonly used as an insulating space and a current sensor disposing space. Accordingly, this leads to miniaturization of the electric power converter.

In the metal base plate 11, a through-hole 11*a* is formed at a position that faces the through-holes 22*a* to 22*c*, and a through-hole 11*b* is formed at a position that faces the through-holes 22*d* to 22*f*. In addition, as illustrated in FIG. 3, in the cover 8, the third opening 204*a* is formed at a position that faces the through-hole 11*a*. The AC connector 188, from which the AC-side relay conductors 802*a* to 802*c* are led out, is formed in the third opening 204*a*. In addition, in the cover 8, the fourth opening 204*b* is formed at a position that faces the through-hole 11*b*. The AC connector 188, from which the AC-side relay conductors 802*d* to 802*f* are led out, is formed in the fourth opening 204*b*.

According to this, even when the driver circuit substrate 22 is disposed between the AC connector 188 and the power semiconductor modules 300*a* to 301*c*, complication of interconnections of the AC-side relay conductors 802*a* to 802*f* is suppressed, and thus it is possible to realize miniaturization of the electric power converter 200.

In addition, the power semiconductor modules 300*a* to 300*c* and 301*a* to 301*c* have a rectangular shape having sides in a longitudinal direction and sides in a width direction. Similarly, the capacitor module 500 has a rectangular shape having sides in a longitudinal direction and sides in a width direction. In addition, the power semiconductor modules 300*a* to 300*c* and 301*a* to 301*c* are disposed in such a manner that sides in a width direction are arranged in a row along a side of the capacitor module 500 in a longitudinal direction.

According to this, the distance between the power semiconductor modules 300*a* to 300*c* becomes short, and thus a distance between the capacitor terminals 503*a* to 503*c* can be made to be short. Accordingly, it is possible to suppress heat generation due to a backflow current which flows between the power semiconductor modules 300*a* to 300*c*. This is also true of the power semiconductor modules 301*a* to 301*c*.

In addition, the through-holes 22*a* to 22*f* are provided in the driver circuit substrate 22 along arrangement direction of the AC-side relay conductors 802*a* to 802*f*. In addition, the driver circuit substrate 22 has a rectangular shape in which a side of the capacitor module 500 in a longitudinal direction is set as one side, and a side, which has a length obtained by adding a length of a side of the capacitor module 500 in a width direction and a length of a side of the power semiconductor modules 300*a* to 300*c* and 301*a* to 301*c* in a longitudinal direction, is set as another side.

According to this, the through-holes 22*a* to 22*f* are arranged along one side of the driver circuit substrate 22, and thus even though a plurality of the through-holes are provided, it is possible to secure a circuit interconnection area in a wide range.

FIG. 14 is a cross-sectional perspective view taken along a plane B in FIG. 13. A connection portion 23*a* is a connection portion between the signal terminal 325U of the power semiconductor module 300*a* and the driver circuit substrate 22. A connection portion 23*b* is a connection portion between the signal terminal 325L of the power semiconductor module 300*a* and the driver circuit substrate 22. The connection portions 23*a* and 23*b* are formed by a solder material.

The through-hole 11*a* of the metal base plate 11 is formed up to positions that face the connection portions 23*a* and 23*b*. According to this, a connection process at the connection portions 23*a* and 23*b* can be performed through the through-hole 11*a* of the metal base plate 11 in a state in which the driver circuit substrate 22 is fixed to the metal base plate 11.

In addition, when the electric power converter 200 is projected from an upper surface thereof, the control circuit substrate 20 is disposed at a position in which a projection portion of the control circuit substrate 20 does not overlap a projection portion of the through-hole 11*a*. According to this, the control circuit substrate 20 does not interfere in the connection process at the connection portions 23*a* and 23*b*, and the control circuit substrate 20 can reduce an effect of an electromagnetic noise from the connection portions 23*a* and 23*b*.

In this embodiment, the driver circuit substrate 22 is formed in a large size so as to face the power semiconductor module 300*a* and the like, and the capacitor module 500. In this case, the AC terminal 320B is disposed to be more distant from the capacitor module 500 in comparison to the DC positive electrode terminal 315B. In addition, the control terminal 325L is disposed between the DC positive electrode terminal 315B and the AC terminal 320B. In addition, the connection portion 23*b* is disposed at a position that faces the control terminal 325L.

According to this, on the driver circuit substrate 22, the through-hole 22*b* is disposed on a side closer to an edge of the driver circuit substrate 22 in comparison to a driver circuit 25 to be described later in FIG. 15. Accordingly, it is possible to suppress a decrease in the strength of the driver circuit substrate 22 due to formation of the through-hole 22*b*, and thus it is possible to improve a vibration resisting performance.

FIG. 15 is a bottom view of the driver circuit substrate 22.

As illustrated in FIG. 3, the AC-side relay conductors 802*a* to 802*f* extend toward a third opening 204*a* side or a fourth opening 204*b* side which is opposite to the power semiconductor module through the driver circuit substrate 22. So as to make an interconnection distance of the AC-side relay conductors 802*a* to 802*f* short, the through-holes 22*a* to 22*f*, through which the AC-side relay conductors 802*a* to 802*f* pass, are necessary for the driver circuit substrate 22. In addition, the driver circuit substrate 22 includes a heavy-current-side interconnection 28 or a weak-current-side interconnection 27. In this case, the through-holes 22*a* to 22*f* are necessary for the driver circuit substrate 22, and a constant space for disposition of the heavy-current-side interconnection 28 or the weak-current-side interconnection 27 is also necessary for the driver circuit substrate 22. According to this, in the driver circuit substrate 22, when the heavy-current-side interconnection 28 or the weak-current-side interconnection 27 is mounted to bypass the through-holes 22*a* to 22*f*, this configuration leads to an increase in an interconnection distance, or an increase in an area of the driver circuit substrate.

Accordingly, in this embodiment, the driver circuit 25 is disposed at the periphery of the connection portion 23*a* and the connection portion 23*b*. The transformer 24 is disposed on a side that is opposite to the through-holes 22*a* to 22*f* with the driver circuit 25 interposed therebetween. The transformer 24 performs transformation from a low voltage to a high voltage, and supplies a transformed voltage to the driver circuit 25. A connector 26 is electrically connected to the control circuit substrate 20 through a harness and the like. In addition, the weak-current-side interconnection 27 connects the connector 26 and the transformer 24. In addition, the heavy-current-side interconnection 28 connects the transformer 24 and the driver circuit 25.

According to this, it is possible to avoid interference between the through-holes 22*a* to 22*f* and the heavy-current-side interconnection 28, and interference between the through-holes 22*a* to 22*f* and the weak-current-side interconnection 27. In addition, it is possible to secure a wide space at the periphery of the heavy-current-side interconnection 28 or the weak-current-side interconnection 27, and thus circuit interconnection of the driver circuit substrate 22 becomes easy.

In addition, a transformer input voltage that is input through the weak-current-side interconnection 27 is significantly lower than an AC voltage that flows through the AC-side relay conductors 802a to 802f. Accordingly, in this embodiment, the transformer 24 is disposed on a side that is opposite to the through-holes 22a to 22f with the driver circuit 25 interposed therebetween.

Accordingly, the driver circuit 25 serves as a buffer region, and thus a weak-current-system circuit of the transformer 24 is less likely to be susceptible to an effect of a voltage variation in an AC voltage that flows through the AC-side relay conductors 802a to 802f, and thus it is possible to improve reliability of the electric power converter.

However, the transformer 24 may be disposed at a region between a mounting region of the driver circuit 25 on one side and a mounting region of the driver circuit 25 on the other side. The region is a region in which an interconnection region of the heavy-current-side interconnection 28 is small. Accordingly, when the transformer 24 is mounted in the region, it is possible to stabilize a potential of the weak-current-side interconnection 27.

FIG. 16 is a cross-sectional view taken along the plane C of the flow channel forming body 12 illustrated in FIG. 5. The flow channel forming body 12 integrally forms the first flow channel forming body 441 that forms the first flow channel portion 19a to the sixth flow channel portion 19f, and the second flow channel forming body 442 that forms the seventh flow channel portion 19g. The first flow channel forming body 441 is disposed at a lateral side of the second flow channel forming body 442. The second flow channel forming body 442 forms the storage space 405 that stores the capacitor module 500 on an upper side of the seventh flow channel portion 19g. In addition, the flow channel forming body 12 has a wall 445 for formation of a side wall of the storage space 405 and a part of the seventh flow channel portion 19g. That is, the first flow channel portion 19a to the sixth flow channel portion 19f are formed at positions which face the wall 445.

According to this, in the capacitor module 500, the bottom surface of capacitor module 500 is cooled down by the seventh flow channel portion 19g, and a side surface of the capacitor module 500 in a height direction is also cooled down by the first flow channel portion 19a to the sixth flow channel portion 19f, and thus cooling characteristics of the capacitor module 500 increase.

In addition, the wall 445 forms a part of the storage space 405, a part of the seventh flow channel portion 19g, and a part of the fourth flow channel portion 19d. According to this, the storage space to be cooled down can be partitioned by the wall 445, and thus it is possible to perform cooling in a module unit for the capacitor module or the power semiconductor module. As a result, it is possible to select cooling priority for each storage space.

In addition, the flow channel forming body 12 integrally forms the first flow channel forming body 441, the second flow channel forming body 442, and the third flow channel forming body 444 that forms the eighth flow channel portion 19h. The third flow channel forming body 444 is disposed at a lateral portion of the second flow channel forming body 442. The flow channel forming body 12 has a wall 460 for formation of a side wall of the storage space 405 and a part of the eighth flow channel portion 19h. That is, the eighth flow channel portion 19h is formed at a position that faces the wall 460. According to this, in the capacitor module 500, the bottom surface of capacitor module 500 is cooled down by the seventh flow channel portion 19g, and a side surface of the capacitor module 500 in a height direction is also cooled down by the eighth flow channel portion 19h, and thus cooling characteristics of the capacitor module 500 further increase.

In addition, in the flow channel forming body 12, the third flow channel forming body 444, which forms the eighth flow channel portion 19h, is integrally formed, and thus a structure is further simplified.

In addition, as illustrated in FIG. 12, the capacitor terminals 503a to 503f are formed to straddle an upper portion of the wall 445. According to this, it is possible to mitigate an effect of heat that is transferred between the capacitor module and the power semiconductor module.

In addition, as illustrated in FIG. 12, an insulating member 446 is disposed at an upper end of the wall 445, and comes into contact with the conductor plate 530 on a capacitor side. According to this, it is possible to mitigate an effect of heat that is transferred between the capacitor module and the power semiconductor module.

FIG. 17 is a top view of the electric power converter 200 from which the cover 8, the control circuit substrate 20, the metal base plate 11, and the driver circuit substrate 22 are removed.

In a case where the electric power converter 200 is projected from an upper surface thereof, a projection portion 441s represents a projection portion of the first flow channel forming body 441, a projection portion 442s represents a projection portion of the second flow channel forming body 442, and a projection portion 444s represents a projection portion of the third flow channel forming body 444. The power module for auxiliary machinery 350 is disposed to overlap the projection portion 444s of the third flow channel forming body 444. According to this, the power module for auxiliary machinery 350 can be cooled down by a cooling medium that flows through the eighth flow channel portion 19h.

In addition, the first flow channel forming body 441 and the second flow channel forming body 442 are disposed to face a side wall 12b, a side wall 12c, and a side wall 12d of the flow channel forming body 12 through a cavity portion 12e having an air layer. According to this, even when a difference is present between a temperature of the cooling medium that flows through the first flow channel forming body 441 and the second flow channel forming body 442, and an external environment temperature, the cavity portion 12e serves as a heat insulating layer, and thus it is possible to allow the first flow channel forming body 441 and the second flow channel forming body 442 to be less likely to be susceptible to an effect of the external environment temperature of the electric power converter 200.

REFERENCE SIGNS LIST

8: Cover
11: Metal base plate
11a, 11b: Through-hole
12: Flow channel forming body
12a to 12d: Side wall
12e: Cavity portion
13: Inlet pipe
14: Outlet pipe
19a: First flow channel portion
19b: Second flow channel portion
19c: Third flow channel portion 19*d*: Fourth flow channel portion
19*e*: Fifth flow channel portion
19*f*: Sixth flow channel portion
19*g*: Seventh flow channel portion
19*h*: Eighth flow channel portion
20: Control circuit substrate
21: Connector
22: Driver circuit substrate
22*a* to 22*f*: Through-hole
23*a*, 23*b*: Connection portion
24: Transformer
25: Driver circuit
26: Connector
27: Weak-current-side interconnection
28: Heavy-current-side interconnection
120: AC terminal
136: Battery
138: DC connector
140: Inverter circuit
142: Inverter circuit
150: Upper and lower arm series circuit
153: Collector electrode
154: Gate electrode
155: Emitter electrode for signal
156: Diode
157: Positive electrode terminal
158: Negative electrode terminal
159: AC terminal
163: Collector electrode
164: Gate electrode
165: Emitter electrode for signal
166: Diode
168: Intermediate electrode
172: Control circuit
174: Driver circuit
180: Current sensor
180*a* to 180*f*: Current sensor
188: AC connector
195: Motor for auxiliary machinery
200: Electric power converter
202: First opening
203: Second opening
204*a*: Third opening
204*b*: Fourth opening
205: Fifth opening
300*a* to 300*c*: Power semiconductor module
301*a* to 301*c*: Power semiconductor module
302: Primary module sealing body
304: Module case
304A: Thin portion
304B: Flange
305: Fin
306: Insertion port
307A: First radiating surface
307B: Second radiating surface
309: Screw
315: Conductor plate
315A: DC positive electrode interconnection
315B: DC positive electrode terminal
315C: Auxiliary-module-side DC positive electrode connection terminal
315D: Element-side DC positive electrode connection terminal
318: Conductor plate
319: Conductor plate
319A: DC negative electrode interconnection
319B: DC negative electrode terminal
319C: Auxiliary-module-side DC negative electrode connection terminal
319D: Element-side DC negative electrode connection terminal
320: Conductor plate
320A: AC interconnection
320B: AC terminal
320C: Auxiliary-module-side AC connection terminal
320D: Element-side AC connection terminal
322: Element fixing portion
324U: Signal interconnection
324L: Signal interconnection
325L: Signal terminal
325U: Signal terminal
326L: Auxiliary-module-side signal connection terminal
326U: Auxiliary-module-side signal connection terminal
327L: Element-side signal connection terminal
327U: Element-side signal connection terminal
328: IGBT
328A: Control electrode
329: Intermediate electrode
330: IGBT
330A: Control electrode
333: Insulating member
348: First sealing resin
350: Power module for auxiliary machinery
350A: Driver circuit
350B: Inverter circuit
351: Second sealing resin
360: Height of power semiconductor module
370: Connection portion
371: Bonding wire
400*a* to 400*c*, 402*a* to 402*c*: Opening
404: Opening
405: Storage space
406*a* to 406*f*: Convex portion
407: Cooling portion
409: Sealing member
420: Lower cover
441: First flow channel forming body
441*s*: Projected portion of first flow channel forming body
442: Second flow channel forming body
442*s*: Projected portion of second flow channel forming body
443: Height of seventh flow channel portion
444: Third flow channel forming body
444*s*: Projected portion of third flow channel forming body
445: Wall
446: Insulating member
447, 448: Straight fin
460: Wall
500: Capacitor module
501: Laminated conductor plate
502: Capacitor case
503*a* to 503*f*: Capacitor terminal
504: Negative-electrode-side capacitor terminal
505: Negative electrode conductor plate
506: Positive-electrode-side capacitor terminal
507: Positive electrode conductor plate
508: Negative-electrode-side power supply terminal
509: Positive-electrode-side power supply terminal
510: Negative-electrode-side electric power line
511: Storage portion
512: Positive-electrode-side electric power line
514: Capacitor cell
515*a*, 515*b*: Capacitor cell for noise filter 516, 517: Capacitor terminal for auxiliary machinery
520a to 520h: Hole
522a: Positioning protrusion
530: Relay conductor portion
540: Height of capacitor module
550: Base plate
551a: Positioning hole
552a: Positioning hole
554a, 554b: Positioning clip
557: Heat path
558a, 558b: Positioning hole
559: Heat path
560: Lead
561: Lead
571: First stage fitting portion
572: Second stage fitting portion
573: Third stage fitting portion
574: Thickness of first-stage fitting portion
575: Thickness of second-stage fitting portion
576: Thickness of third-stage fitting portion
600: Auxiliary molded body
608: Interconnection insulating portion
802a to 802f: AC-side relay conductor
803: Supporting member
804, 805: Flow of leakage current
DEF: Differential gear
EGN: Engine
MG1: Motor generator
MG2: Motor generator
TM: Transmission
TSM: Power distribution mechanism

The invention claimed is:

1. An electric power converter, comprising:
a power semiconductor module including a power semiconductor element that converts a DC current to an AC current;
a first capacitor cell that smooths a DC voltage;
a bus bar that electrically connects the power semiconductor module and the first capacitor cell;
a flow channel forming body that forms a flow channel through which a cooling refrigerant flows; and
a base plate that is embedded in a sealing material and is disposed between the bus bar and the first capacitor cell for radiating heat from the bus bar and the first capacitor cell, wherein the bus bar is parallel to the base plate; and
a fixing member that is configured of an insulating member and includes an engagement portion that comes into contact with a surface of the base plate on a side opposite to a side in which the bus bar is disposed;
a through-hole in which the fixing member is inserted is formed in the bus bar and the base plate, and
the fixing member is inserted into the through-hole, and pinches the base plate in combination with the bus bar by using the engagement portion;
wherein the base plate forms an opening through which a capacitor terminal extending from the first capacitor cell passes, and the base plate is disposed in thermal contact with the flow channel forming body.

2. The electric power converter according to claim 1, further comprising:
a second capacitor cell for a noise filter configured to remove common mode noise; and
a metal case in which the power semiconductor module and the second capacitor cell are stored,
wherein the base plate is formed from a metal plate material,
the base plate is electrically connected to the case that is set to a ground potential,
one electrode of the second capacitor cell is electrically connected to the bus bar, and
the other electrode of the second capacitor cell is electrically connected to the base plate.

3. The electric power converter according to claim 2,
wherein the case includes the flow channel forming body, and the base plate is disposed to come into physical contact with the flow channel forming body.

4. The electric power converter according to claim 3, further comprising:
wherein a second insulating member is disposed between the bus bar and the base plate.

5. The electric power converter according to claim 1,
wherein the sealing material seals the capacitor cell, the bus bar, and the base plate.

6. The electric power converter according to claim 1,
wherein the fixing member comprises a positioning clip.

* * * * *